(12) United States Patent
Baur et al.

(10) Patent No.: US 11,592,461 B2
(45) Date of Patent: Feb. 28, 2023

(54) APPARATUS AND METHOD FOR EXAMINING AND/OR PROCESSING A SAMPLE

(71) Applicant: Carl Zeiss SMT GmbH, Oberkochen (DE)

(72) Inventors: Christof Baur, Darmstadt (DE); Michael Budach, Hanau (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 17/681,028

(22) Filed: Feb. 25, 2022

(65) Prior Publication Data
US 2022/0178965 A1 Jun. 9, 2022

Related U.S. Application Data

(60) Division of application No. 17/128,498, filed on Dec. 21, 2020, now Pat. No. 11,262,378, which is a continuation of application No. PCT/EP2019/066235, filed on Jun. 19, 2019.

(30) Foreign Application Priority Data

Jun. 21, 2018 (DE) .................. 102018210098.5

(51) Int. Cl.
G01Q 30/02 (2010.01)
G01Q 20/02 (2010.01)
H01J 37/28 (2006.01)

(52) U.S. Cl.
CPC ............ G01Q 30/02 (2013.01); G01Q 20/02 (2013.01); H01J 37/28 (2013.01); H01J 2237/022 (2013.01)

(58) Field of Classification Search
CPC ......... G01Q 30/02; G01Q 20/02; H01J 37/28; H01J 2237/022
USPC .......................... 250/306, 307, 309, 310, 311
See application file for complete search history.

(56) References Cited

U.S. PATENT DOCUMENTS

| 4,440,475 A | 4/1984 | Colliaux |
| 5,394,741 A | 3/1995 | Kajimura et al. |
| 5,634,230 A | 6/1997 | Maurer |

(Continued)

FOREIGN PATENT DOCUMENTS

| CN | 102084431 | 6/2011 |
| EP | 0 596 494 | 5/1994 |

(Continued)

OTHER PUBLICATIONS

Baur, C. et al., "Nanoparticle manipulation by mechanical pushing: underlying phenomena and real-time monitoring", Nanotechnology, vol. 9, pp. 360-364, (1998).

(Continued)

Primary Examiner — Nicole M Ippolito
(74) Attorney, Agent, or Firm — Fish & Richardson P.C.

(57) ABSTRACT

The present invention relates to an apparatus for examining and/or processing a sample, said apparatus comprising: (a) a scanning particle microscope for providing a beam of charged particles, which can be directed on a surface of the sample; and (b) a scanning probe microscope with a deflectable probe; (c) wherein a detection structure is attached to the deflectable probe.

20 Claims, 27 Drawing Sheets

(56) References Cited

U.S. PATENT DOCUMENTS

| | | | |
|---|---|---|---|
| 6,509,969 B1* | 1/2003 | Takeshita | G01C 19/00 850/10 |
| 6,552,340 B1 | 4/2003 | Krivanek et al. | |
| 6,642,517 B1 | 11/2003 | Ghislain et al. | |
| 6,812,460 B1 | 11/2004 | Stallcup, II et al. | |
| 7,395,727 B2 | 7/2008 | Moore | |
| 8,696,818 B2 | 4/2014 | Robinson et al. | |
| 2003/0053598 A1* | 3/2003 | Sumi | B41J 2/45 378/162 |
| 2011/0138506 A1 | 6/2011 | Humphris | |
| 2014/0027512 A1 | 1/2014 | Baur et al. | |
| 2015/0169997 A1 | 6/2015 | Weber et al. | |
| 2016/0025771 A1 | 1/2016 | Erickson et al. | |
| 2016/0202288 A1 | 7/2016 | Erickson et al. | |
| 2017/0256380 A1 | 9/2017 | Brogden et al. | |
| 2018/0240645 A1 | 8/2018 | Huang et al. | |
| 2020/0279717 A1* | 9/2020 | Furuyama | H01J 37/061 |
| 2021/0109126 A1 | 4/2021 | Baur et al. | |

FOREIGN PATENT DOCUMENTS

| | | | |
|---|---|---|---|
| EP | 2 023 372 | 2/2009 | |
| JP | H 05107050 A | 4/1993 | G01B 21/30 |
| JP | H 06117847 A | 4/1994 | G01B 21/30 |
| JP | 2984154 B2 | 11/1999 | |
| JP | 2017-523440 A | 8/2017 | G01Q 21/02 |
| KR | 10-2014-0035367 A | 3/2014 | H01J 37/28 |
| TW | 201809676 | 3/2018 | |
| WO | WO 2017/186198 | 11/2017 | |
| WO | WO 2018/029151 | 2/2018 | |

OTHER PUBLICATIONS

Beard, J.D. et al., "An atomic force microscope nanoscalpel for nanolithography and biological applications," Nanotechnology, vol. 20 (2009), 445302, p. 1-10.

The German Office Action for German Application No. DE 10 2018 210 098.5, dated Apr. 29, 2019.

The International Search Report and Written Opinion of the International Searching Authority for International Application No. PCT/EP2019/066235 dated Jan. 10, 2020.

The Taiwan Office Action and Search Report for Taiwan Application No. TW 108121315 dated May 8, 2020.

Darwich, S. et al., "Manipulation of gold colloidal nanoparticles with atomic force microscopy in dynamic mode: influence of particle—substrate chemistry and morphology, and operating conditions" Beilstein Journal of Nanotechnology, vol. 2, pp. 85-98 (Feb. 2011).

Durston, P.J. et al., "Manipulation of passivated gold clusters on graphite with the scanning tunneling microscope" Applied Physics Letters, vol. 72, No. 2, pp. 176-178, (Jan. 12, 1998).

Ermakov, A. V. et al., "A novel AFM/STM/SEM system", *Review of Scientific Instructions*, Bd. 56, pp. 2853-2854 (Nov. 165, 2018).

Gallagher, E. et al., "EUVL mask repair: expanding options with nanomachining," BACUS, vol. 29, Issue No. 3 (Mar. 2013), p. 1-8.

Heinrich, K.F.J. , "Electron probe microanalysis by specimen current measurement", Proc. 4th Internat. Congress on X-Ray Optics and Microanalysis, Optique des rayons X et microanalyse (eds R. Castaing, P. Deschamps, J. Philibert), Hermann, Paris, p. 159-167 (1966).

Libinson, A.G., "Tilt Dependence of the Secondary Electron Emission at Low Excitation Energy", *Scanning*, vol. 21, pp. 23-26 (1998).

Martin, M. et al., "Manipulation of Ag nanoparticles utilizing noncontact atomic force microscopy" Applied Physics Letters, vol. 73, No. 11, Sep. 1998, p. 1505-1507.

Mayer, J. et al., "TEM sample preparation and FIB-induced damage", MRS Bulletin, vol. 32, pp. 400-407 (May 2007).

Myers, B., "TEM Sample Preparation with the FIB/SEM", Nuance Center, Northwestern University—Evanston, IL (2009).

Pieper, H.H. et al., "Morphology and nanostructure of CeO2(111) surfaces of single crystals and Si(111) supported ceria films," Physical Chemistry Chemical Physics, vol. 14, No. 44, p. 15361ff, (2012).

Pieper, H.H., "Morphology and electric potential of pristine and gold covered surfaces with fluorite structure," Thesis, University of Osnabrück (2012).

Requicha, R., "Nanomanipulation with the atomic force microscope," Nanotechnology Online, ISBN: 9783527628155 (Jul. 15, 2010).

Schaffer, M. et al. "Sample preparation for atomic-resolution STEM a low voltages by FIB", Ultramicroscopy, vol. 114, pp. 62-71 (2012).

Troyon, M. et al., "A Scanning Force Microscope Combined with a Scanning Electron Microscope for Multidimensional Data Analysis", *Microscopy Microanalysis Microstructures*, vol. 8, pp. 393-402 (Dec. 1997).

Wittry, D.B., "Secondary electron emission in the electron probe", *Optique des rayons X et microanalyse* (eds R. Castaing, P. Deschamps, J. Philibert), Hermann, Paris, pp. 168-180 (1966).

Notice of Allowance issued by the Korean Intellectual Property Office for Application No. KR 10-2021-7001732, by Examiner Jeuk Oh, dated Nov. 22, 2022 (With English Translation).

* cited by examiner

Fig. 4
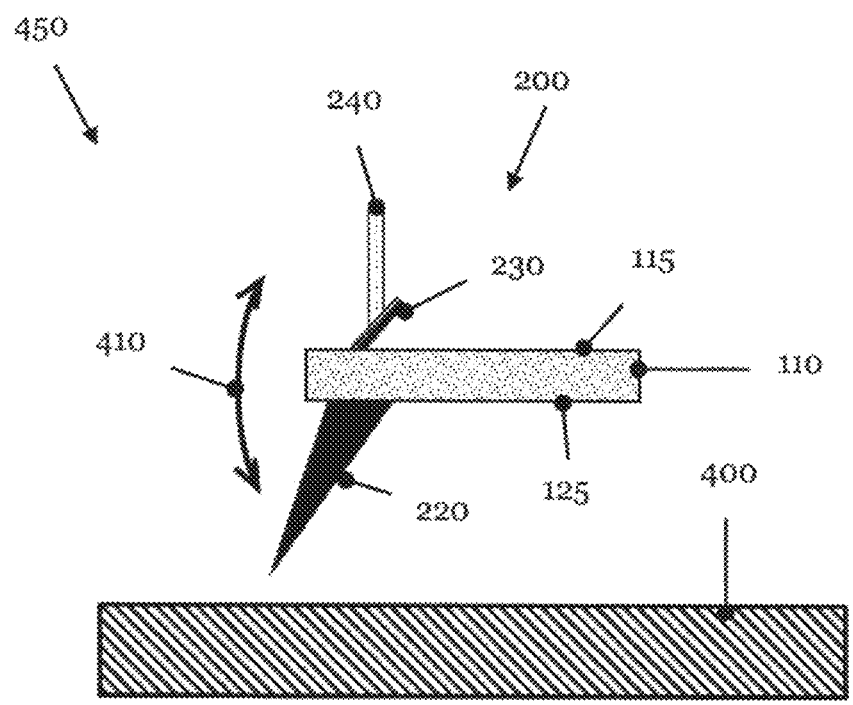
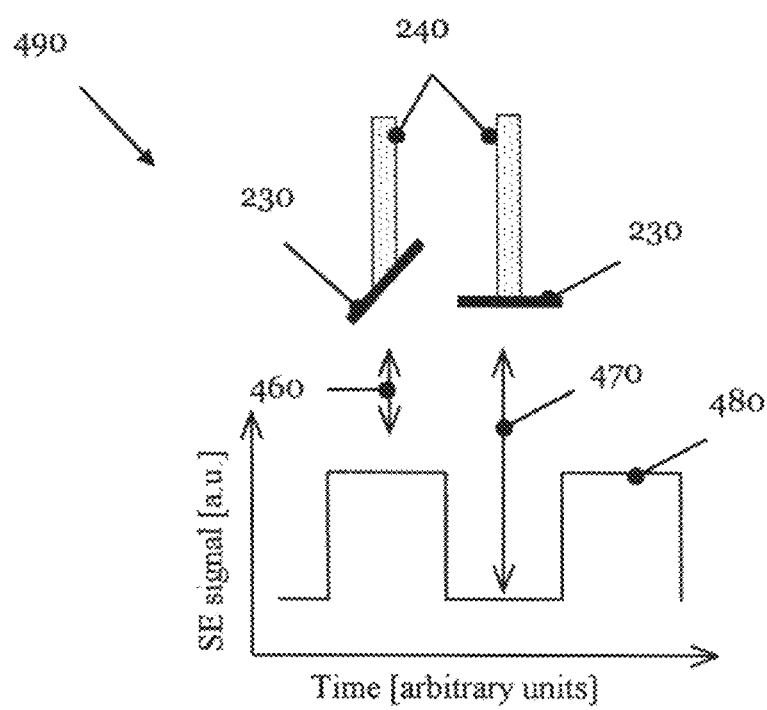

Fig. 5
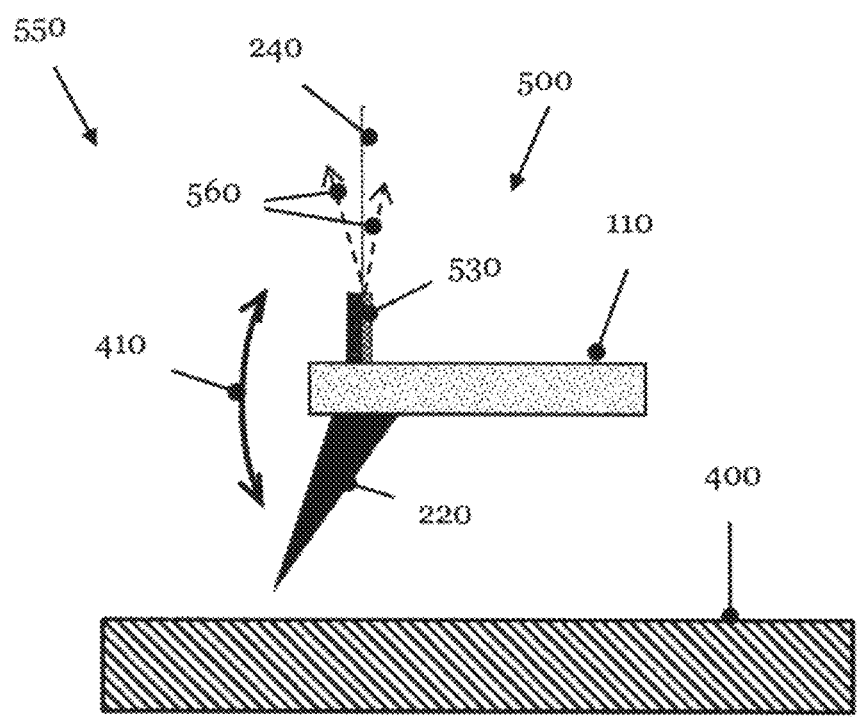
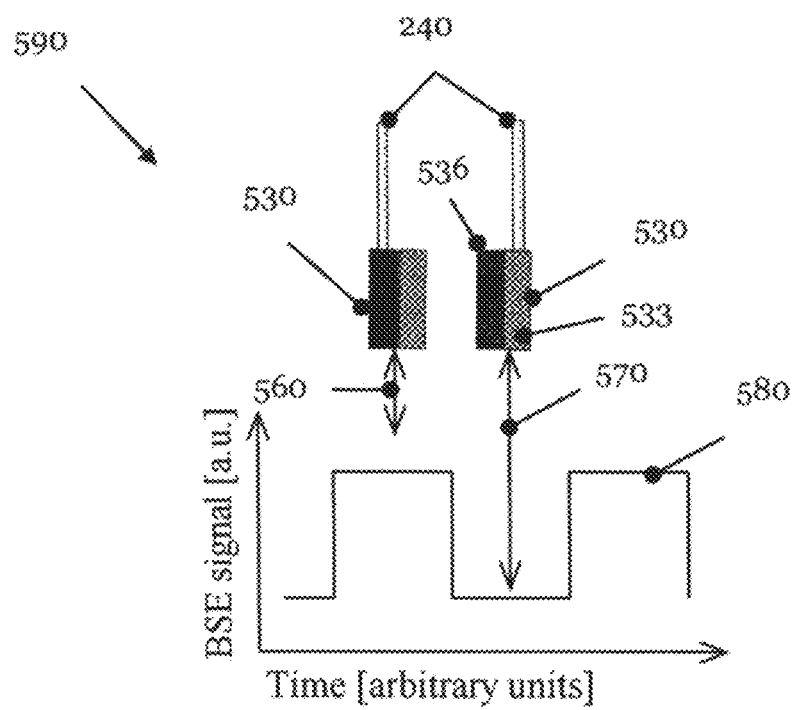

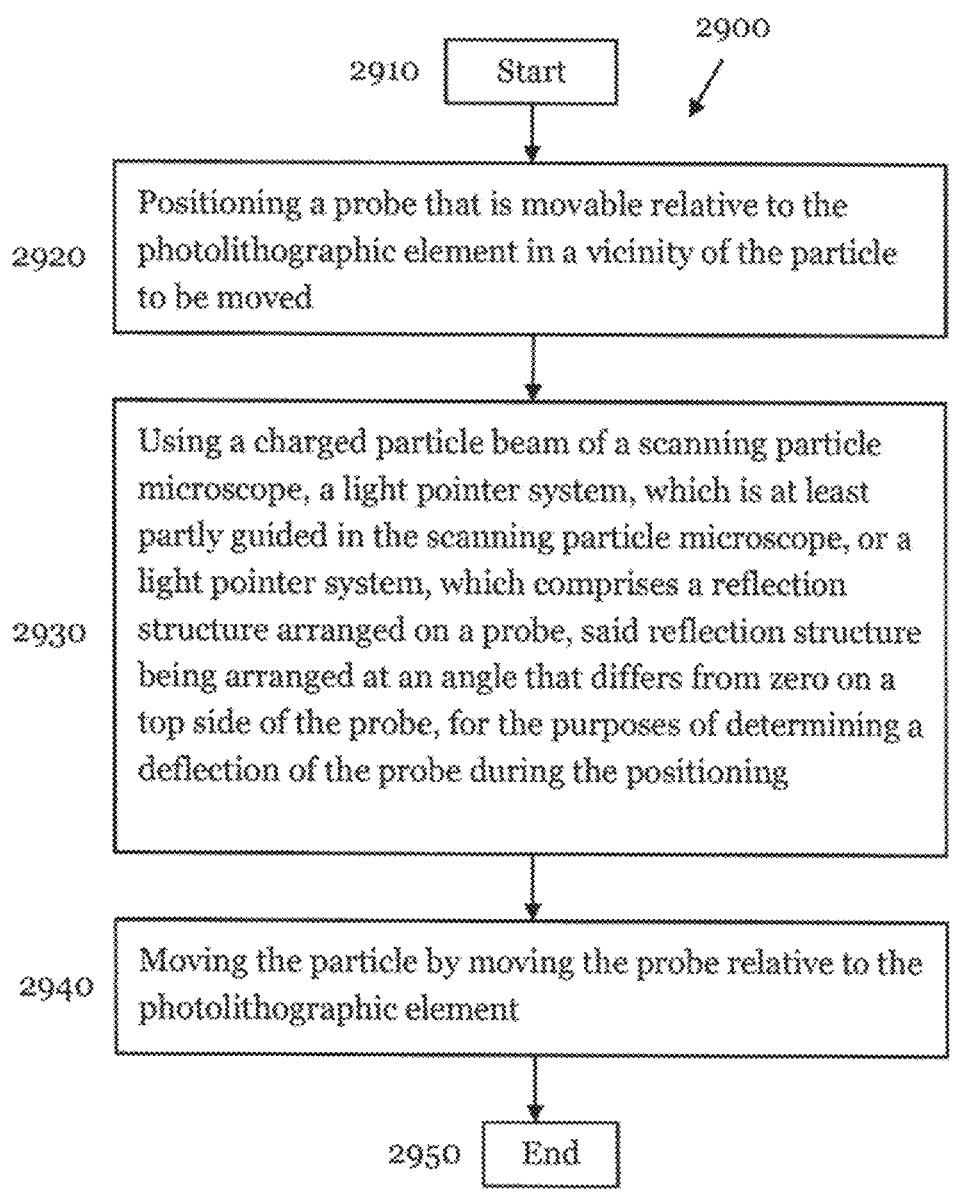

APPARATUS AND METHOD FOR EXAMINING AND/OR PROCESSING A SAMPLE

CROSS-REFERENCE TO RELATED APPLICATIONS

This application is a division of and claims priority under 35 U.S.C. § 120 to U.S. application Ser. No. 17/128,498, filed on Dec. 21, 2020, which is a continuation of PCT Application No. PCT/EP2019/066235, filed on Jun. 19, 2019, which claims priority from German Application No. 10 2018 210 098.5, filed on Jun. 21, 2018. The entire contents of each of these priority applications are incorporated herein by reference.

TECHNICAL FIELD

The present invention relates to an apparatus and a method for examining and/or processing a sample. In particular, the present invention relates to an apparatus and a method for moving a particle of the sample.

BACKGROUND

As a consequence of the growing integration density in the semiconductor industry, photolithography masks have to image increasingly smaller structures on wafers. In terms of photolithography, the trend towards growing integration density is addressed by shifting the exposure wavelength of photolithography systems to ever shorter wavelengths. Currently frequently used as a light source in photolithography systems or lithography systems is an ArF (argon fluoride) excimer laser that emits at a wavelength of approximately 193 nm.

Particles from the surroundings can deposit on photolithographic masks, photomasks or simply masks and impair the imaging function of said masks. Particles are removed as standard from the surface of the masks by cleaning steps during mask production and during operation of the masks. In general, a particle can be present on a sample and have a negative influence on the function of the sample.

The decreasing structural dimensions of photolithographic masks are increasing the difficulty of cleaning processes. Moreover, as a result of the decreasing exposure wavelength, ever smaller foreign or dirt particles adsorbed on the surface of the mask are becoming visible during an exposure process on a wafer.

Some documents that examine the movement of nanoparticles with the aid of a nano-manipulator or micro-manipulator, for instance the measuring tip of a scanning probe microscope, are mentioned below in exemplary fashion: H. H. Pieper: "Morphology and electric potential of pristine and gold covered surfaces with fluorite structure," Thesis, University of Osnabrück 2012; S. Darwich et al.: "Manipulation of gold colloidal nanoparticles with atomic force microscopy in dynamic mode: influence of particle—substrate chemistry and morphology, and operating conditions," Beilstein J. Nanotechnol., vol. 2 (2011), p. 85-98; H. H. Pieper et al.: "Morphology and nanostructure of $CeO_2(111)$ surfaces of single crystals and Si(111) supported ceria films," Phys. Chemistry Chemical Physics, vol. 14, p. 15361ff, 2013; E. Gallagher et al.: "EUVL mask repair: expanding options with nanomachining," BACUS, vol. 3, no. 3 (2013), p. 1-8; M. Martin et al.: "Manipulation of Ag nanoparticles utilizing noncontact atomic force microscopy," Appl. Phys. Lett., vol. 72, no. 11, September 1998, p. 1505-1507; P. J. Durston et al.: "Manipulation of passivated gold clusters on graphite with the scanning tunneling microscope," Appl. Phys. Lett., vol. 72, no. 2, January 1998, p. 176-178; R. Requicha: "Nanomanipulation with the atomic force microscope," Nanotechnology Online, ISBN: 9783527628155; C. Baur et al.: "Nanoparticle manipulation by mechanical pushing: underlying phenomena and real-time monitoring," Nanotechnology 9 (1998), p. 360-364; J. D. Beard et al.: "An atomic force microscope nanoscalpel for nanolithography and biological applications," Nanotechnology 20 (2009), 445302, p. 1-10; U.S. Pat. Nos. 6,812,460 B1; and 8,696,818 B2.

The following documents, specified in exemplary fashion, relate to the production of TEM samples with the aid of the in-situ lift-out method: J. Mayer et al.: "TEM sample preparation and FIB-induced damage," MRS Bulletin, vol. 32, May 2007, p. 400-407; B. Myers: "TEM Sample Preparation with the FIB/SEM," Nuance Center, Northwestern University—Evanston, 2009; M. Schaffer et al.: "Sample preparation for atomic STEM at low voltages by FIB," Ultramicroscopy, vol. 114, p. 62-71 (2012); and US 2017/0256380 A1.

In the article "A novel AFM/STM/SEM system," Rev. Sci. Instrum. 65 (9), pp. 2853-2954, September 1994, the authors A. V. Ermakov and E. L. Garfunkel describe the use of an electron beam in order to detect a vibration of a cantilever of an AFM.

The US patent document U.S. Pat. No. 4,440,475 describes a combination of a scanning electron microscope and an optical microscope, in which some of the optical light beam is guided in the column of the scanning electron microscope when the optical microscope operates in the operating mode with a higher resolution.

U.S. Pat. No. 7,395,727 B2 describes a nano-manipulator which allows the detection of its tip landing on a sample surface.

The combination of a scanning particle microscope and a scanning probe microscope in one instrument requires the spatial separation of the two microscopes for reasons of space, as a result of which switching between the operation of the two microscopes becomes complicated and slow. If the two microscopes are arranged tightly adjacent to one another, it is necessary to find a compromise in the capability of the two microscopes.

The present invention therefore addresses the problem of specifying apparatuses and a method that facilitate an improvement in the examination and/or processing of a sample.

SUMMARY

According to an exemplary embodiment of the present invention, this problem is solved by apparatuses according to claims 1 and 13 and by a method according to claim 18. In a first embodiment, an apparatus for examining and/or processing a sample comprises: (a) a scanning particle microscope for providing a beam of charged particles, which can be directed on a surface of the sample; and (b) a scanning probe microscope with a deflectable probe; (c) wherein a detection structure is attached to the deflectable probe.

An apparatus according to the invention can have a compact build as a result of a charged particle beam of a scanning particle microscope being used in combination with a detection structure attached to the probe of a scanning probe microscope in a manner similar to a conventional light pointer system for determining the deflection of a probe of a scanning probe microscope. The interaction regions of the probe of the scanning probe microscope and of the beam of charged particles of the scanning particle microscope can overlap without having to make a compromise in relation to the capability of the two microscopes. Moreover, it is possible to very quickly switch between a scanning particle microscope mode of operation and a scanning probe microscope mode of operation. In particular, the charged particle beam of the scanning particle microscope can be used to monitor the approach of the probe of the scanning probe microscope to a sample and/or the processing of the sample using the probe.

The scanning particle microscope can be configured to carry out at least one element of the group of: directing the beam of charged particles onto the detection structure, carrying out a line scan of the beam of charged particles over the detection structure and scanning the beam of charged particles over the detection structure.

The detection structure can have a material composition that differs from the material composition of the deflectable probe. Different material compositions of the detection structure and the probe lead to a change in the secondary electron yield or to a change in the backscatter coefficient for backscattered electrons, which facilitate a detection of a deflection of the probe of the scanning probe microscope.

The detection structure can have a cylindrical, conical, rod-shaped or n-gon structure, wherein n≥3.

The detection structure can be attached to a front side of the probe and a measuring tip can be attached to a back side of the probe.

The detection structure can comprise at least two separate, adjacent materials with different atomic numbers.

The at least two separate, adjacent materials of the detection structure can be separated along a longitudinal axis of the deflectable probe.

The detection structure can be configured to optimize an emission of charged secondary electrons and/or backscattered electrons.

The detection structure can comprise a detection area, which is configured to optimize an emission of charged secondary electrons and/or backscattered electrons.

The detection area can be aligned in such a way that it includes an angle of ±20° with the beam of charged particles in the case of a non-deflected probe.

The detection area can be embodied to decouple a measurement signal produced by the detection area from an incidence surface of the charged particle beam onto the detection area over a distance of at least 10, preferably at least 50, more preferably at least 100 and most preferably at least 500 beam diameters of the beam of charged particles.

A detection area satisfies at least two functions. Firstly, it optimizes the measurement signal of the detection area caused by the beam of charged particles. Secondly, the detection area simplifies the adjustment of the charged particle beam on the probe. On the one hand, this is achieved by deliberate defocusing of the beam of charged particles in respect of the detection area and, on the other hand, by an adjustment tolerance of the charged particle beam relative to the longitudinal axis of the probe. In the first exemplary embodiment described here, the charged particle beam is preferably directed onto the detection area of the probe as a stationary beam.

The beam diameter of the charged particle beam is defined as the width at which the intensity has dropped to half of the maximum intensity, i.e., the FWHM (full width at half maximum) width of the intensity distribution.

The detection area can comprise a width of 90%, preferably 50%, more preferably 30% and most preferably 10% of the probe.

Like a focused light beam of a light pointer system, a charged particle beam in the described first exemplary embodiment uses a significant percentage of the detection.

The detection area can have dimensions that facilitate a detection of the deflection of the probe using a beam that has a cross-sectional area of more than 10 $nm^2$, preferably 50 $nm^2$, more preferably 100 $nm^2$ and most preferably more than 500 $nm^2$.

The cross-sectional area of a charged particle beam relates to the area of the full width at half maximum (FWHM) of its intensity profile.

This embodiment facilitates a deliberate defocusing of the charged particle beam in relation to the detection area of the probe. As a result, the spatial dependence of the measurement signal induced by the detection area as a result of the charged particle beam can be reduced.

The detection area can have a rectangular embodiment. Further, the detection area can be arranged in an angular range of 60° to 90°, preferably 70° to 90°, more preferably 80° to 90° and most preferably 85° to 90° in relation to a surface of the probe.

As a result of this embodiment of the detection area, an optical light pointer system of a conventional scanning probe microscope can be approximately reproduced with the aid of a charged particle beam and a correspondingly arranged detector.

The detection structure and the probe can be produced in integral fashion. However, it is also possible to produce the probe and the detection structure separately and apply the detection structure to the probe in a second step, for example by adhesive bonding. Moreover, it is possible to provide a cutout in the probe, into which the detection structure can be inserted.

The beam of charged particles and a surface of the probe can include an angular range of 60° to 120°, preferably 70° to 110°, more preferably 80° to 100° and most preferably 85° to 95°.

The sample can likewise be arranged in a horizontal manner as a result of a substantially horizontal arrangement of the probe. As a result, large samples, such as, for instance, wafers or photolithographic masks, can be easily affixed and precisely positioned in respect of a charged particle beam of a scanning particle microscope and/or a probe of a scanning probe microscope.

Here and elsewhere in this application, the expression "substantially" denotes an indication of a measurement variable within its error tolerances when the measurement variable is measured using measuring instruments in accordance with the prior art.

The detection structure can have a material composition that is optimized for the emission of secondary electrons. Materials with a high atomic number, such as gold, for example, are advantageous to this end.

The detection area can have a curvature. The curvature of the detection area can be embodied to linearize a measurement signal of the deflection of the probe.

The deflection of a probe typically leads to a strong, in particular nonlinear variation in the measurement signal of the detection area. It is possible to compensate this nonlinearity by an appropriate design of a closed-loop control for a vibration of the probe. However, it is also possible to choose the surface form or curvature of the detection area in such a way that there is a virtually linear relationship between the deflection of the probe and the measurement signal produced by the detection area arranged on the probe. The translational invariance of the charged particle beam over the detection area is forgone in this exemplary embodiment.

The scanning particle microscope can be embodied to direct a stationary beam of charged particles onto the detection area.

The detection structure can comprise at least one areal element and a normal vector of the areal element can be directed substantially parallel or antiparallel to the longitudinal axis of the deflectable probe.

The at least one areal element can comprise a rectangular structure, which extends over a majority of the width of the probe. The majority of the width of the probe denotes a portion of the width of the probe that is greater than 50% of the width of the probe.

The detection structure can be attached to the back side of the deflectable probe. A measuring tip can be attached to the detection structure.

The detection structure can comprise at least two areal elements, which are arranged along the longitudinal axis of the deflectable probe. The at least two areal elements can be arranged parallel to one another. The at least two areal elements can have different heights. The at least two areal elements can comprise a rectangular structure.

The scanning particle microscope can be embodied to scan the beam of charged particles along the longitudinal axis of the deflectable probe.

The detection structure and the measuring tip can be attached to the same side of the deflectable probe. The detection structure and the measuring tip can be attached to the back side of the deflectable probe. The measuring tip can be attached to the detection structure.

The detection structure can comprise at least one marking. The at least one marking can be embodied to cause a change in position in an image of the scanning particle microscope in the case of deflection of the probe, said change in position allowing the deflection of the probe to be determined.

In the above-described first exemplary embodiment of a detection structure in the form of a detection area, a defocused charged particle beam is typically fixedly positioned on the detection area. In a second exemplary embodiment, a focused electron beam is scanned over a region of the probe in which the at least one marking is arranged on the probe. The deflection of the probe is detected by way of a lateral offset of the at least one marking in the image of the marking. It is an advantage of this exemplary embodiment of the detection structure that a detector within a column of the scanning particle microscope (i.e., an in-lens detector) can be used to detect the deflection of the probe. This facilitates a compact embodiment of an above-described apparatus. The scanning particle microscope operates in the scanning mode for the purposes of analyzing the sample and/or the probe or the deflection of the probe. This means that settings of the scanning particle microscope only have to be changed slightly between scanning a sample or a photolithographic element and scanning the probe. This facilitates quick switching between scanning of the element and of the probe.

The at least one marking can be embodied as a tip and can be arranged on a surface of the probe on which the beam of charged particles is incident on the probe. The at least one marking can comprise a material that differs from the material of the probe. In particular, the marking can comprise a material that optimizes material contrast between the probe and the at least one marking.

As a result, imaging of the marking yields a material contrast in addition to a topology contrast when imaging the marking or the region of the probe comprising the marking.

The detection structure can comprise at least two markings whose heights differ from one another. The at least two markings can be arranged on a line that extends substantially perpendicular to the longitudinal axis of the probe.

Two markings with different heights arranged on the probe facilitate by way of a difference measurement the determination of the lateral offset of the probe in the case of the deflection thereof, said difference measurement allowing an increase in the accuracy with which the deflection of the probe can be determined. In particular, carrying out a reference measurement can be avoided in the case of a detection structure embodied in the form of two markings.

An apparatus according to the invention further can have an optical light pointer system and the detection structure can comprise a reflection structure, which is embodied to reflect optical radiation of the optical light pointer system, and the reflection structure can be arranged at an angle that differs from zero in relation to a front side of the deflectable probe.

This embodiment facilitates the simultaneous or sequential examination and/or processing of a sample using a charged particle beam and the probe of a scanning probe microscope in a common or at least partly overlapping interaction region of the scanning particle microscope and the scanning probe microscope with the sample. Further, this embodiment allows a first tool to process the sample and the second tool to examine or monitor the processing procedure.

The reflection structure can comprise a mirror. The reflection structure can comprise a metal or a metallic tempering layer. The reflection structure can comprise an angle between a front side of the probe in the range of 70° to 100°, preferably 75° to 95°, more preferably 80° to 90° and most preferably 83° to 87°. The reflection structure can comprise an imaging function.

An interaction region of the scanning probe microscope and the interaction region of the scanning particle microscope can at least partly overlap.

The imaging of the marking with the scanning particle microscope can be implemented by scanning the beam of charged particles at a first frequency, wherein the first frequency is higher than a vibration frequency of the probe by at least a factor of 5, preferably by a factor of 10, more preferably by a factor of 30 and most preferably by a factor of 100. However, the first frequency can also be lower than the vibration frequency of the probe.

Further, an apparatus according to the invention can comprise a signal processing unit configured to capture even high vibration frequencies of the probe in a pictorial manner using the stroboscopic effect.

The probe can have an opening, which is embodied in such a way that the beam of charged particles can be directed onto the sample through the opening. Further, the opening of the probe can be embodied such that the beam of charged particles can scan the sample through the opening for imaging purposes.

The dimensions of the opening are chosen in such a way that, on the one hand, the scanning region of the charged particle beam is not unnecessarily restricted. On the other hand, the width of the opening extending perpendicular to the longitudinal axis of the probe, in particular, is chosen in such a way that there is no risk to the mechanical stability of the probe.

The opening can have any form. Symmetrical openings, such as, for instance, circular, triangular, rectangular or square openings, are preferred.

This configuration facilitates a very good overlap of the interaction regions of the probe and of the beam of charged particles with a sample. In particular, this configuration allows, for example, the ascertainment of a position of a particle present on a sample in relation to the interaction region of the probe with the particle. This is a great advantage when manipulating the particle with the aid of the probe. Moreover, there can be a very quick and simple switchover between examining the sample and examining the probe by way of the charged particle beam of the scanning particle microscope in this embodiment of the probe.

The probe can have an electrically conductive embodiment for the purposes of shielding and/or compensating an electrostatic charge of the sample.

The sample can be electrostatically charged if electrically insulating samples, such as photolithographic masks, for example, are examined and/or processed using a charged particle beam. Often, a shielding apparatus in the form of a tightly meshed grid is applied to the output of the particle optical unit of a scanning particle microscope in order to shield electrostatic charging of a sample, for example a photolithographic mask. There is no space for the shielding apparatus of a scanning particle microscope if a probe of a scanning probe microscope is placed under the outlet opening of the scanning particle microscope. The probe can at least partly additionally adopt the function of a shielding element by virtue of said probe of the scanning probe microscope having a conductive embodiment. This applies, in particular, if the probe has an opening for the passage of the charged particle beam.

If the sample is determined to have electrostatic charge when the probe approaches a sample surface, an electrostatic charge of a sample can be compensated by applying a voltage to an electrically conductive probe such that a risk-free examination of the sample surface by use of the probe is rendered possible even if the sample has an electrostatic charge.

The probe can be connected to a piezoelectric quad-morph piezo-actuator, which is configured to deflect the probe.

Tubular piezo-actuators are often used to position the probe of a scanning probe microscope on a sample surface. However, this embodiment of a piezo-actuator is disadvantageous for a scanning probe microscope of an apparatus according to the invention since the outlet opening of the charged particle beam of the scanning particle microscope typically has a distance of a few millimeters from the surface of a sample in the best-case scenario. A piezo-actuator embodied in the form of a quad-morph actuator element exploits the restricted space available between the outlet opening of the charged particle beam and the sample in optimal fashion without having to resort to mechanically unstable alternative solutions.

An apparatus according to the invention can comprise a control unit embodied to carry out a coordinate transformation between a coordinate system of the photolithographic element and the coordinate system of the probe within a time interval of <50 µs, preferably <10 µs, more preferably <1 µs and most preferably <0.1 µs.

Scanning probe microscopes are usually constructed in such a way that the coordinate system of the piezo-actuator and the coordinate system of the sample or the sample stage, on which the sample is arranged, are aligned with respect to one another. However, this often is not possible in the case of an in-situ configuration of the two microscopes in the case of the combination of a scanning particle microscope and a scanning probe microscope on account of the already aforementioned restrictions in terms of space. The control unit of an apparatus according to the invention is able to carry out coordinate transformations virtually in real-time, i.e., with minimal delay. This ability facilitates a quick reaction of the apparatus to a detected deflection of the probe. A restriction in the throughput of an apparatus according to the invention caused by the configuration thereof can be largely avoided. A fast coordinate transformation can be implemented in the control unit, for example in the form of an FPGA (field programmable gate array) or an ASIC (application-specific integrated circuit).

Further, the control unit can be configured to carry out the method steps of the method according to the invention.

In a second embodiment, an apparatus for examining and/or processing a sample comprises: (a) a scanning particle microscope for providing a beam of charged particles, which can be directed on a surface of the sample; and (b) a scanning probe microscope with a deflectable probe and a light pointer system for detecting a deflection of the probe; (c) wherein the light pointer system is guided at least in part in a column of the scanning particle microscope.

This embodiment of an apparatus according to the invention allows a very compact realization of a combination of a scanning particle microscope and a scanning probe microscope, the interaction regions of which with a sample or a photolithographic element overlap. Despite the compact structure of the apparatus according to the invention, the deflection of the probe of the scanning probe microscope can be detected by use of a light pointer system that has proven its worth.

At its outlet opening for the beam of charged particles, the scanning particle microscope can have at least one lens for the light pointer system with an opening for the passage of the beam of charged particles. The lens for the light pointer system can be embodied as a ring-shaped lens.

The scanning particle microscope can comprise a deflection mirror and a window of the light pointer system. The deflection mirror can deflect optical radiation of the light pointer system through substantially 90°. The deflection mirror can have an opening for the passage of the beam of charged particles.

This allows the light source, which can be realized by a laser, for example, and the photodetector, which can be embodied in the form of a four-quadrant photodiode, for example, to be arranged outside of the scanning particle microscope.

The optical elements of the light pointer system, which are arranged in the scanning particle microscope, can have an optically substantially transparent and electrically conductive coating. The optically transparent and electrically conductive coating can comprise an indium tin oxide (ITO) layer.

A conductive coating of the optical elements, i.e., the lenses and mirrors in the scanning particle microscope, can substantially prevent electrostatic charging of the optical components by scattered electrons.

The apparatus according to the invention can comprise a light source that is arranged outside of the scanning particle microscope and that is embodied to deflect the probe, wherein the optical intensity of the light source is partly guided in the scanning particle microscope. The light source for deflecting the probe can use the optical elements of the light pointer system in the scanning particle microscope. The light source can comprise a laser system. The light source can use a different wavelength range from the light source of the light pointer system.

An apparatus according to the invention can have a compact structure as a result of the excitation of the deflection and the detection of the deflection using the same optical elements within the scanning particle microscope.

Further, an apparatus according to the invention can comprise at least one first container for storing at least one precursor gas and at least one second container for storing at least one etching gas. Moreover, an apparatus according to the invention can comprise at least one third container for stockpiling an additive gas. The additive gas can be mixed with the precursor gas or the etching gas where necessary in order to assist the local deposition reaction on the sample and/or on the probe or in order to assist a local etching reaction on the sample and/or on the probe.

The gases stored in the containers allow not only the examination of a sample, for example a photolithographic mask and/or a wafer, but also the processing thereof in the case of an apparatus according to the invention.

An apparatus according to the invention can be configured to deposit a sacrificial tip on the probe of the scanning probe microscope. The sacrificial tip can be deposited on the probe of the scanning probe microscope with the aid of the beam of charged particles of the scanning particle microscope and one or more precursor gases stored in the first container.

The charged particle beam can pass through the probe for the purposes of depositing the sacrificial tip. The scanning probe microscope can be further embodied to rotate the probe about its longitudinal axis.

The above-described apparatuses can further be embodied to connect a particle present on the sample to the probe. The particle can be connected to the probe by depositing material on the probe and/or the particle by use of a deposition process induced on the precursor gas by the beam of charged particles.

The charged particle beam can pass through the probe for the purposes of depositing the connecting material. Further, the charged particle beam can be guided through the opening of the probe for the purposes of depositing the connecting material.

Further, the apparatuses according to the invention can be embodied to separate a particle connected to the probe from the probe. The particle can be separated from the probe by carrying out a local EBIE (electron beam induced etching) process The particle can reliably be removed by connecting a particle to the probe of the scanning probe microscope, even from points of a sample that are difficult to access. A cleaning process of the sample often cannot reach a particle at points that are difficult to access.

The connecting material can form a connection between the probe and the particle, said connection being detachable to a restricted extent or not detachable.

It is advantageous if the connecting material forms a connection that is detachable to a restricted extent between the probe or the sacrificial tip of the probe and the particle. In this case, the probe can be used for successively removing a number of particles. However, it is also possible for the connecting material to realize a non-detachable connection between the probe and the particle. In this case, the probe that has been loaded with a particle is replaced with a new probe.

A precursor gas for depositing a connecting material on the probe and/or on the particle can comprise at least one element from the group of: ethene ($C_2H_4$), styrene ($C_8H_8$), pyrene ($C_{16}H_{10}$), hexadecane ($C_{16}H_{34}$), liquid paraffins, formic acid ($CH_2O_2$), propionic acid ($C_3H_6O_2$), and methyl methacrylate ($C_5H_8O_2$).

It is advantageous if the connecting material has a large carbon component. A large carbon component of the connecting material facilitates a simple separation of the particle, which was removed from the sample, from the probe of the scanning probe microscope. Moreover, during the separation of the connection between the probe and the particle in an EBIE process, connecting materials that predominantly or at least partly comprise carbon form volatile compounds, which can easily be removed from the reaction region of the local process.

The material for connecting probe and particle can be electrically conductive. A precursor gas for depositing an electrically conductive connecting material can comprise a metal carbonyl. A metal carbonyl can comprise at least one element from the group: chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_{12}$), and iron pentacarbonyl ($Fe(CO)_5$).

An etching gas can comprise water vapor, hydrogen peroxide, xenon difluoride ($XeF_2$), xenon dichloride ($XeCl_2$), xenon tetrachloride ($XeCl_4$), XNO, $XNO_2$, $XONO_2$, $X_2O$, $XO_2$, $X_2O_2$, $X_2O_4$ and $X_2O_6$, where X is a halogen, and nitrosyl chloride (NOCl).

The probe can comprise a measuring tip for examining the sample. The apparatuses according to the invention can be embodied to deposit a sacrificial tip onto the probe. Further, the described apparatuses can be embodied to deposit the sacrificial tip on the measurement tip of the probe.

For the purposes of depositing a sacrificial tip on the probe, it is advantageous if the tip of the sacrificial tip and the charged particle beam are collinear. It is therefore advantageous if the probe is embodied to be rotatable about its longitudinal axis. Typically, parameters of the charged particle beam must be adapted for the purposes of depositing the sacrificial tip.

The sacrificial tip can have a length in a range of 50 nm to 10 µm, preferably 100 nm to 5 µm, more preferably 200 nm to 2 µm and most preferably of 500 nm to 1 µm. The sacrificial tip can have a cylindrical form with a diameter in a range of 5 nm to 1000 nm, preferably 10 nm to 500 nm, more preferably 15 nm to 200 nm, and most preferably 20 nm to 100 nm.

The sacrificial tip of the probe can be carbon-based. A precursor gas for depositing sacrificial tips can comprise at least one element of: ethene ($C_2H_4$), styrene ($C_8H_8$), pyrene ($C_{16}H_{10}$), hexadecane ($C_{16}H_{34}$), liquid paraffins, formic acid ($CH_2O_2$), propionic acid ($C_3H_6O_2$), and methyl methacrylate ($C_5H_8O_2$).

A sacrificial tip can be electrically conductive. A precursor gas for depositing an electrically conductive sacrificial tip can comprise a metal carbonyl. A metal carbonyl can comprise at least one element from the group: chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_{12}$), and iron pentacarbonyl ($Fe(CO)_5$).

The probe can comprise a cantilever with a measuring tip and a fastening region, which is attached to the end of the cantilever lying opposite the measuring tip. By use of its fastening region, the probe can be connected to a piezo-actuator of the scanning probe microscope.

The beam of charged particles can comprise at least one element of the group of: an electron beam and an ion beam.

An electron beam used to examine the sample substantially does not damage a sample, for example a photolithographic element. Further, an electron-beam-induced deposition process for depositing a sacrificial tip and/or for connecting the sacrificial tip to a particle is advantageous in that the deposition reaction can be localized precisely. Moreover, damage to the probe or the sacrificial tip can be kept low by the use of an EBIE process for removing a particle from the probe or from the sacrificial tip.

The particle can comprise a diameter of 5 nm to 10 µm, preferably 10 nm to 5 µm, more preferably 15 nm to 20 µm and most preferably 20 nm to 1 µm.

The sacrificial tip of the probe positioned to receive a particle can have a distance from the particle to be removed of 0 nm to 2000 nm, preferably 0 nm to 500 nm, more preferably 0 nm to 100 nm and most preferably of 0 nm to 50 nm.

The sample can comprise a photolithographic element. The photolithographic element can comprise at least one element from the group: a photolithographic mask, a template for nanoimprint lithography and a wafer. The photolithographic mask can comprise a reflecting or transmitting mask. Moreover, the photolithographic mask can comprise any mask type.

The apparatuses can comprise one or more displacement elements, which are embodied to carry out a relative movement between the probe and the sample in three spatial directions.

Apparatuses according to the invention can comprise a modified scanning electron microscope and least one atomic force microscope.

The apparatuses according to the invention can further comprise a detector for detecting x-ray radiation.

A particle can only be examined to a very restricted extent on a sample, for example on a photomask. Firstly, particles are often localized at points of the sample that are difficult to access. Secondly, the analysis options in situ are very restricted since, of course, the analysis of the particle should not modify the surrounding region of the sample on the one hand. On the other hand, the analysis of the particle should not be falsified by the sample surrounding the particle. If particles are removed from the sample with the aid of a cleaning process, said particles are lost, as a rule, to an analysis of the material composition thereof.

In combination with the charged particle beam that excites the particle removed from the sample, the detector can be used for determining a material composition of the particle.

In one embodiment, the method for moving a particle on a sample includes the following steps: (a) positioning a probe that is movable relative to the sample in the vicinity of the particle to be moved; (b) using a charged particle beam of a scanning particle microscope, a light pointer system, which is at least partly guided in the scanning particle microscope, or a light pointer system, which comprises a reflection structure arranged on a probe, said reflection structure being arranged at an angle that differs from zero on a surface of the probe, for the purposes of determining a deflection of the probe during the positioning; and (c) moving the particle by moving the probe relative to the sample.

A charged particle beam of a scanning particle microscope can be used to examine a sample. A particle identified by the charged particle beam should then be moved with the aid of the probe of a scanning probe microscope. By way of the movement, the particle should be detached from its anchoring or locking on the sample such that the particle can be removed from the sample during a cleaning process. It is also possible, by moving by way of the probe, to convey the particle to a location on the sample at which the particle does not impair the function of the sample, for example the photolithographic element. In the case of a photomask, this can be the non-active region of a photomask or an absorbing pattern element, for example.

The probe must be positioned at, or in the vicinity of, the particle for the purposes of moving the identified particle. Making the probe of a scanning probe microscope approach a sample surface is a risky process since the sample and/or the probe can be damaged in the process. It is therefore necessary to monitor this process. As a result of use being made here of the charged particle beam of the scanning particle microscope, which discovered the particle, use being made of a light pointer system, which at least partly guides the optical radiation in the scanning particle microscope, or use being made of a light pointer system, which has a reflection structure on the probe of the scanning probe microscope, said reflection structure having an angle in relation to the surface of the probe that differs from zero, the method according to the invention requires, on the one hand, minimal outlay for the alignment of the probe in respect of the identified particle and facilitates, on the other hand, a risk-free approach of the probe to a sample or a particle to be moved. The use of a light pointer system moreover facilitates the determination of the forces exerted on a probe and hence the control thereof.

The positioning of the probe relative to the sample can comprise the determination of a force acting between the probe and the sample.

Damage to the probe and/or the sample when the probe approaches the surface of the sample can be avoided by measuring the interaction between the probe and the sample.

The method according to the invention can further include the step of: imaging the sample and/or the particle using the particle beam of the scanning particle microscope.

The described method can further include the step of: switching between determining the deflection of the probe and imaging of the sample.

It is a significant advantage of the described method that the combination of a scanning particle microscope and a scanning probe microscope, the interaction regions of which with a sample overlap, facilitates a quick switchover between the modes of operation of the individual microscopes. Consequently, the movement of a particle on a sample surface can also be monitored in addition to the approach procedure of the probe to a sample. As a result, the nature of a trial-and-error process can be at least partly removed from the movement of a particle on a sample.

The method according to the invention can further comprise the step of: connecting the probe to the particle. Connecting the probe to the particle can comprise the step of: depositing material on the probe and/or the particle.

In addition to moving a particle with the aid of the probe of the scanning probe microscope, it is also possible to connect the particle to the probe by depositing material on or between these two elements. After producing a stable mechanical connection between the probe and the particle, the particle can be moved in defined fashion by carrying out a relative movement between the probe and the sample. In particular, the particle can be removed from the sample.

The method according to the invention can further include the step of: analyzing the particle with the aid of the beam of charged particles and an energy-dispersive detector for electromagnetic radiation. The beam of charged particles can excite the particle and the x-ray radiation originating from the particle can be analyzed by an energy-dispersive x-ray radiation detector.

An advantage of connecting the probe to a particle is that the particle coupled to the probe can be supplied to an examination of its material composition that is not influenced by the sample surroundings. As a result, it is possible to at least partly determine the particle-generating source(s). Consequently, the particle analysis represents an important step for removing this particle source (these particle sources).

The described method can further comprise the step of: removing the particle from the probe. Removing the particle from the probe can further comprise carrying out a local etching process that is induced by a charged particle beam.

By removing the particle from the probe, a probe laden with a particle need not be replaced but can be used for moving or removing further particles.

Determining the deflection of the probe can comprise: positioning the charged particle beam on a detection area attached to the probe.

The described method can further comprise the step of: setting a cross-sectional area of the beam of charged particles such that the beam has a cross-sectional area of more than 10 $nm^2$, preferably 20 $nm^2$, more preferably 50 $nm^2$ and most preferably more than 100 $nm^2$.

As already explained above, the charged particle beam is deliberately defocused in respect of the detection area attached to the probe in a first exemplary embodiment of the method according to the invention such that the spatial dependence of the measurement signal induced by the charged particle beam of the probe is reduced. Further, the charged particle beam is not scanned over the probe in this exemplary embodiment; instead, it is set to a fixed position within the areal interaction region of the probe.

Determining the deflection of the probe can comprise: scanning the charged particle beam over the probe. In particular, determining the deflection of the probe can comprise: scanning the charged particle beam over a region of the probe that has at least one marking.

The method according to the invention can further comprise the step of: synchronizing the scanning of the charged particle beam over the probe with a vibration of the probe.

The described method can further include the step of: carrying out a coordinate transformation between a coordinate system of the probe and the coordinate system of the sample in a time interval <50 µs, preferably <10 µs, more preferably <1 µs and most preferably <0.1 µs.

The method according to the invention can further include the step of: detecting x-ray radiation originating from a particle using an energy-dispersive x-ray radiation detector.

Finally, a computer program can comprise instructions which, when executed by a computer system, cause the apparatuses according to one of claims 1 to 17 to carry out the method steps according to claims 18 to 20.

DESCRIPTION OF DRAWINGS

The following detailed description describes currently preferred exemplary embodiments of the invention, with reference being made to the Figures, in which:

FIG. 4 illustrates a schematic section through a probe vibrating over a sample surface, said probe having a detection area, in the upper partial image (diagram 450) and elucidates extremal positions of the detection area during a vibration of the probe of the upper partial image and the associated secondary electron signal in the lower partial image (diagram 490);

FIG. 5 reproduces the upper partial image of FIG. 4 in the upper partial image (diagram 550), wherein the probe comprises a second exemplary embodiment of a detection structure, and symbolizes extremal positions of the detection structure during a vibration of the probe of the upper partial image and the associated backscattered electrons in the lower partial image (diagram 590);

FIG. 29 illustrates a flowchart for the method according to the invention.

DETAILED DESCRIPTION

Currently preferred embodiments of apparatuses according to the invention and of a method according to the invention for examining and/or processing a sample are explained in greater detail below using the example of a photolithographic mask. However, the use of the apparatuses according to the invention and of the method according to the invention is not restricted to the examples discussed below. Rather, these can be used generally to examine and/or process a photolithographic element. In particular, the apparatuses and methods described in this application can be used to analyze and/or modify highly sensitive samples with structures in the nanometer range. By way of example, the apparatuses according to the invention and the method according to the invention could be used to examine and/or modify biological samples.

Figure 1:
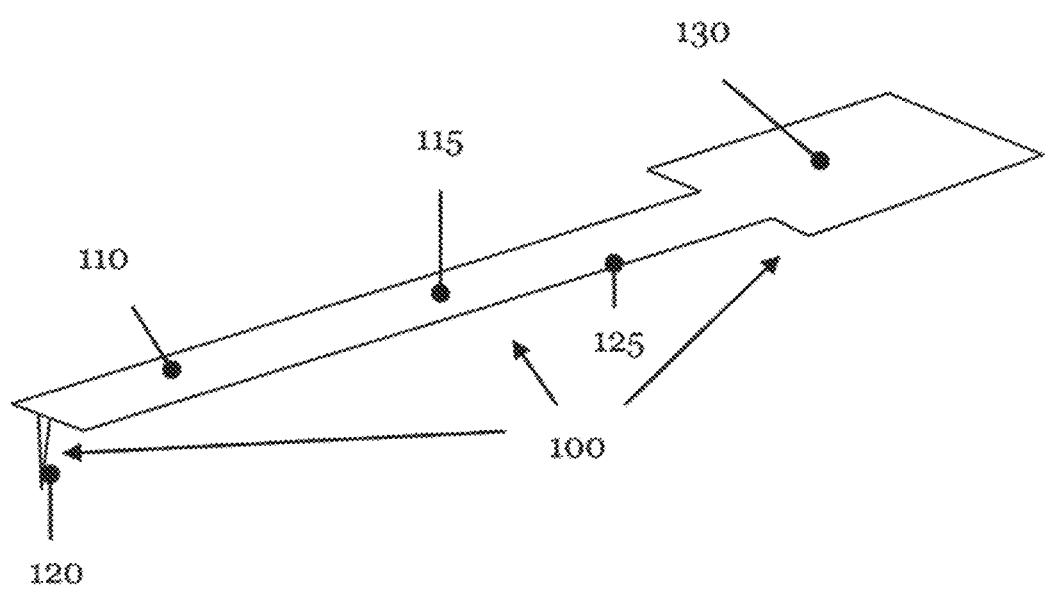
FIG. 1 schematically shows a probe with a cantilever, a measuring tip and a fastening region.

FIG. 1 schematically presents an example of a probe 100 for a scanning probe microscope. The exemplary probe 100 comprises a bending beam 110 or a lever arm 110. The bending beam 110 hereinafter—as customary in the technical field—is referred to as cantilever 110. The cantilever 110 of the probe 100 has a measurement tip 120 at one end (the free end). The measuring tip 120 is applied to a back side 125 of the cantilever 110 of the probe 100. Below, the side lying opposite the measuring tip 120 is referred to as the front side 115 or top side 115 of the probe 100. In the example of the FIG. 1, the measuring tip 120 comprises an elongated thin tip having a small radius of curvature, which tip is embodied to analyze a sample surface such as, for instance, a mask or a wafer. At the opposite end to the measurement tip 120 or the free end, the cantilever 110 of the probe 100 has a fastening region 130. With the aid of the fastening region 130, the probe 100 can be connected to a piezo-actuator, which is incorporated into a measuring head of a scanning probe microscope (not illustrated in FIG. 1).

The cantilever 110 of the probe 100 can be moved by use of a movement of the fastening region 130. In particular, the cantilever 110 can be excited to vibrate. To this end, the fastening region 130 of the probe 100—as already described above—can be connected to a piezo-actuator that can excite the cantilever 110 to vibrate, for example at or near the resonant frequency of the probe 100 (not reproduced in FIG. 1). A vibrating mode of the cantilever 110 can be used during the approach of the measuring tip 120 to the surface of a sample and/or for sensing a sample in the region of a particle.

Below, the term "sample" comprises elements that have structure elements with dimensions in the micrometer and/or nanometer range on at least one of their surfaces. The structure elements comprise structures that are intended and structure elements that should not be present on a sample, for instance particles. In particular, a sample can comprise photolithographic elements. Photolithographic elements comprise photolithographic masks, wafers and/or templates for nano-imprint technology.

The cantilever 110 can have a bimorphic structure, i.e., comprise two interconnected layers lying above one another, said layers exhibiting different thermal expansion properties (not illustrated in FIG. 1). Depending on the embodiment, the cantilever 110 can be bent towards or away from the sample surface as a result of depositing energy into said cantilever. By way of example, energy can be introduced locally into the cantilever 110 by irradiation with a laser beam. Further, it is possible to attach a resistor to the cantilever 110 in order to bend the latter toward or away from the sample surface by local heating (not shown in FIG. 1).

As already explained above, the probe 100 can be connected to an actuator, for example in the form of a piezo-actuator, by way of the fastening region 130 (not illustrated in FIG. 1). The piezo-actuator can deflect the cantilever 110 of the probe 100. In particular, the piezo-actuator can move the measuring tip 120 in the direction of a sample surface. Further, the piezo-actuator can excite the cantilever 110 of the probe 100 to vibrate. Preferably, the piezo-actuator excites the cantilever 110 at or close to a resonant frequency of the probe 100. The cantilever 110 can comprise a resistive element that is used for bending the cantilever 110 towards or away from the surface of the mask. Further, use can be made of an additional light source for deflecting the probe 100, the light beam of said light source being partly guided in the scanning particle microscope.

Further, it is possible to deflect the cantilever 110 on account of electrostatic forces and/or on the basis of the inverse piezoelectric effect. Moreover, magnetic fields (magnetostriction) can be used to move the cantilever 110 towards the sample surface or away from the sample surface.

That surface of the cantilever 110 of the probe 100 which is situated opposite the measuring tip 120 can be provided with a thin metallic reflection layer in order to increase the reflectivity of the surface of the cantilever 110 for a light beam that functions as a light pointer (not shown in FIG. 1).

Figure 2:
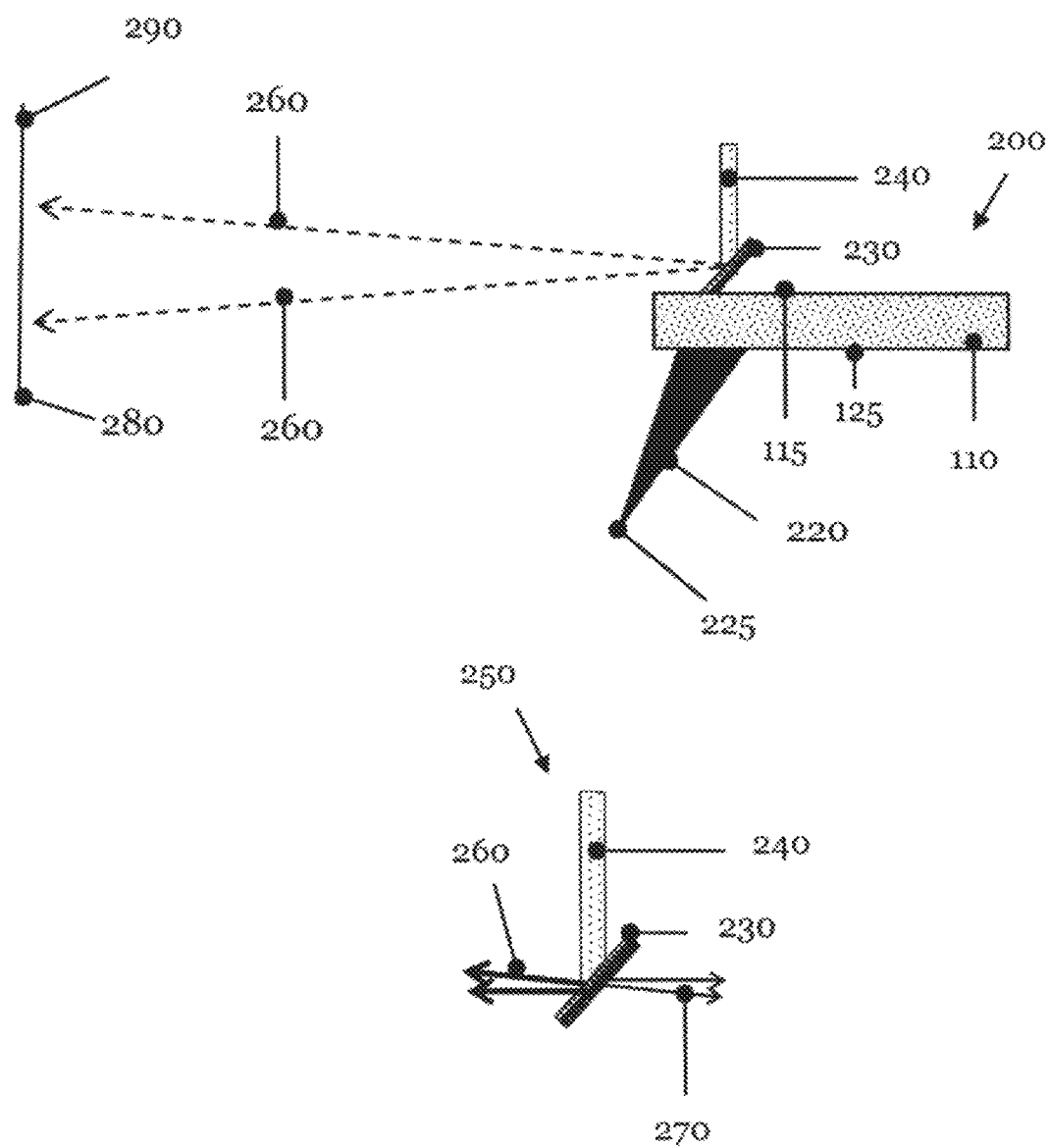
FIG. 2 schematically reproduces a section through a first exemplary embodiment comprising a probe with a detection area and a detection structure.

In the upper partial image, FIG. 2 shows a schematic section through a probe 200 with a cantilever 110 and a measuring tip 220, which has been slanted in relation to the measuring tip 120 of the probe 100. A charged particle beam can sense the tip 225 of the measuring tip 220 with this arrangement of the measuring tip 220. In particular, the charged particle beam can determine contact between the measuring tip 220 and a sample surface and/or a distance from a particle present on the sample surface.

A detection structure 230 in the form of a detection area 230 is attached to the front side 115 of the probe 200, which lies opposite the back side 125, on which the measuring tip 120 is arranged. In the example illustrated in FIG. 2, the detection area 230 has an angle of approximately 40° with respect to the front-side surface 115 of the probe 200, which lies opposite the back-side surface 125 of the probe 200, which has the measuring tip 120. In an alternative exemplary embodiment, the detection area 230 has an angle in the range of 80° to 88° with respect to the front-side surface 115 of the probe 200.

The probe 200 and the detection area 230 can have an integral embodiment. However, it is advantageous to manufacture the detection area 230 from a material whose emission capability is optimized for secondary charged particles in the forward direction. Suitable to this end are materials whose atoms have a high atomic number, such as tungsten, osmium, indium, platinum or gold, for example.

The diagram 250 of FIG. 2 shows the incidence of a charged particle beam 240 on the detection area 230 of the probe 200 in magnified fashion. A beam of charged particles 240 can comprise an electron beam and/or an ion beam. Without loss of generality, a charged particle beam 240 is restricted to an electron beam 240 and secondary charged particles 260 are restricted to secondary electrons 260 in the following observations for reasons of simplicity. The following observations can be made analogously for an ion beam incident on the detection area 230.

The electron beam 240 produces secondary electrons as a result of the interaction with the material of the detection area 230. The secondary electrons comprise scattered or backscattered electrons and secondary electrons (SE). The secondary electrons produced have a broad energy spectrum. As a rule, the spectrum of the secondary electrons has a peak in the region of a few electron volts (eV), followed by a broad background. Due to conservation of energy, the maximum energy of a secondary electron is restricted by the kinetic energy of the electron beam 240 incident on the detection area 230.

Secondary electrons refer to all secondary electrons whose kinetic energy after leaving the detection area is <50 eV. Their most probable energy lies in the energy range of 2 to 5 eV. On account of their low kinetic energy and hence their low range in the material of the detection area 230, the SEs originate from a thin surface layer of the detection area 230 with a thickness of 5 nm to 50 nm. The SEs arise from an inelastic interaction of the electron beam 240 with the atomic shell of the material of the detection area 230.

Produced secondary electrons with a greater kinetic energy are called backscattered secondary electrons (BSE) or simply backscattered electrons (BE). The broad spectrum of the BSE relates to electrons of the electron beam 240, which have lost some of their kinetic energy as a consequence of many scattering processes in the material of the detection area 230. The diameter of the emergence surface from the detection area 230 and the penetration depth of the BSE depends on the material of the detection area 230 and the energy of the electron beam 240. Both lie in the order of micrometers.

The following considerations relate to SEs, i.e., secondary electrons with a kinetic energy <50 eV. As elucidated in the diagram 250 of FIG. 2, SEs can be emitted in the forward direction and in the backward direction by the detection area 230. The SEs 260 leave the detection area 230 in the forward direction if these are emitted by the surface of the detection area 230 on which the primary beam of charged particles 240 is incident. Conversely, the SEs 270 leave the detection area 230 in the backward direction if these are emitted by the surface of the detection area 230 that lies opposite the area of incidence of the primary beam of charged particles 240.

The material composition of the detection area 230 is chosen in such a way that the emission rate of the secondary electrons (SEs) 260 emitted in the forward direction is maximized and the emission rate of the secondary electrons 270 emitted in the backward direction is minimized. To this end, it is advantageous to choose a material for the detection area 230 that has a high atomic number.

The secondary electron yield or SE yield δ is defined as the quotient of the number of emitted secondary electrons and the number of primary electrons of the electron beam 240. The dependence of the SE yield on the angle of incidence on the detection area is approximately described by the following formula (see A. G. Libinson: "Tilt dependence of the secondary electron emission at low excitation," Scanning Vol. 21, pp. 23-26 (1998)):

$$\frac{\delta_{SE}(\theta)}{\delta_{SE}(0)} = \frac{1}{[\cos\theta]^n} \frac{\delta_{SE}(\theta)}{\delta_{SE}(0)} = \frac{1}{[\cos\theta]^n} \tag{1}$$

where $\delta_{SE}(0)$ denotes the SE yield of an electron beam incident perpendicular on a sample, θ denotes the angle of rotation of the sample in relation to the horizontal orientation, i.e., θ=90° describes a grazing incidence of the electron beam on the sample, and η denotes a material- and energy-dependent coefficient, which typically lies in the range of 0.8 to 1.2.

The material composition, the material strength or material thickness and the orientation of the detection area 230 with respect to the incident electron beam 240 can be optimized with the aid of the specified formula in such a way that, for a predetermined electron energy of the charged particle beam 240, a low-noise and low-distortion SE signal of the SE 260 emitted in the forward direction is obtained from the detection area 230. The upper diagram in FIG. 2 schematically illustrates the trajectory of the SEs 260 emitted by the detection area 230 in the forward direction. The SEs 260 are incident on the entrance opening 280 of the detection system 290 or of the detector 290, which is designed to detect secondary electrons 270. By way of example, the detector 290 can be combined from a scintillator and a photomultiplier, for example in the form of an Everhart-Thornley detector.

The configuration of electron beam 240, detector, SEs 260 and detector, schematically illustrated in FIG. 2, comprises an SE detector 290. It is also possible to use two or more SE detectors 290 for detecting the SEs 260.

Figure 3:
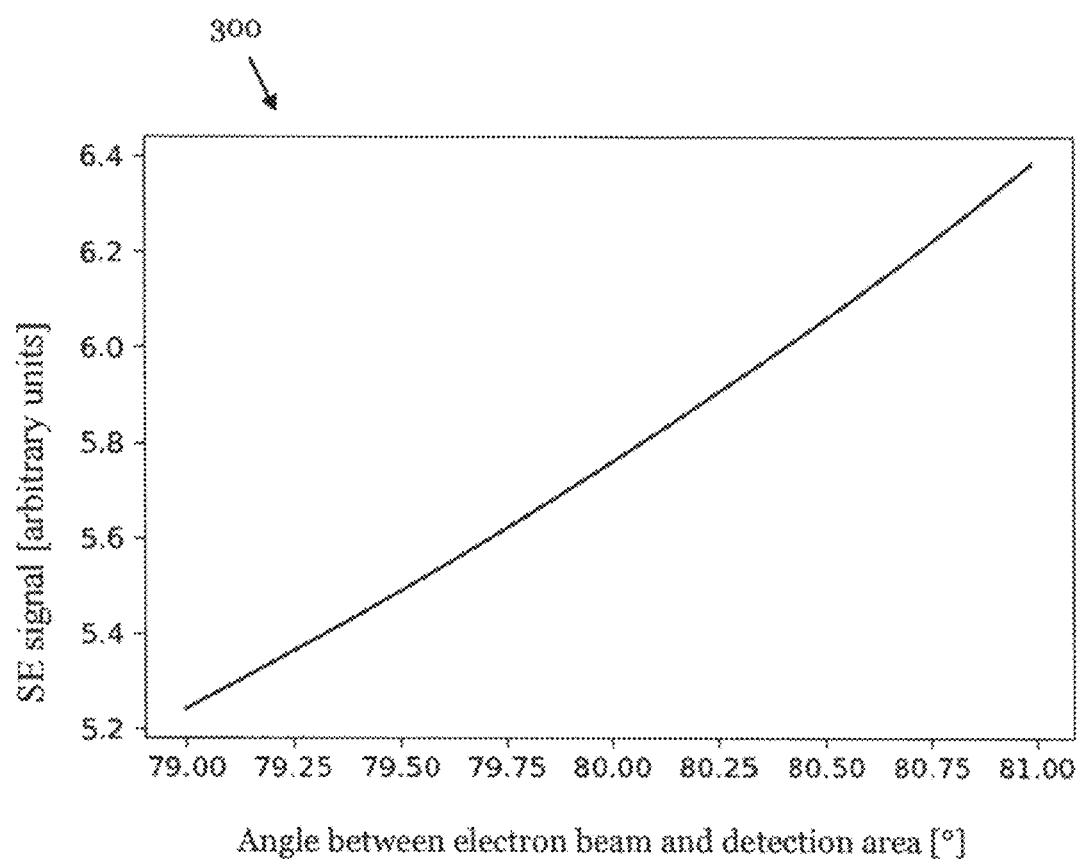
FIG. 3 illustrates the secondary electron yield as a function of the angle between an exciting electron beam and a detector.

The diagram 300 in FIG. 3 shows SE signal strength as a function of the angle between the incident electron beam 240 and the detection area 230. Unlike what is illustrated in FIG. 2, the detection area 230 is almost perpendicular to the plane of the probe 200 or the beam axis of the incident electron beam 240 in this exemplary embodiment and the detection area has only a small angle of less than 10°. Almost all secondary electrons are recorded by the detection system 290 since a suction voltage is applied to the detection system 290. In the example illustrated in FIG. 3, a grazing incidence of the electron beam 240 is chosen in order to optimize the angle dependence of the SE yield. As is evident from the formula specified above, the SE yield δ increases slightly stronger than linearly in the specified small angle range, as expected.

The upper partial image of FIG. 4, or the diagram 450, shows the probe 200 of FIG. 2, which vibrates above a sample 400, for example a photolithographic element 400. The vibration of the probe 200 is symbolized by the double-headed arrow 410. The probe 200 vibrates about an axis that is perpendicular to the plane of the paper. The snapshot of the diagram 450 in FIG. 4 shows the probe 200, or the measuring tip 220 thereof, at the time of closest approach between the probe 200 and the sample 400. Various options for exciting a probe 100, 200 to vibrate are described in the context of FIG. 1.

The lower partial image in FIG. 4, or the diagram 490, elucidates the orientation of the detection area 230 of the probe 200 at the two extremal points, i.e., reversal points of the movement direction of the measuring tip 220 of the probe 200. In the arrangement of the detection area 230 symbolized by way of the double-headed arrow 460, the former has substantially the same alignment as the probe 200 of FIG. 2. The SE yield is high in this configuration on account of the angle-dependence specified in Equation 1. As specified in the diagram 490 in FIG. 4, the SE signal of the SE detector 290 has a maximum.

In the arrangement illustrated above the double-headed arrow 470, the detection area 230 has been rotated substantially into the horizontal direction as a result of the deflection of the probe 200. The SE yield is low in this position of the detection area 230 on account of the angle dependence of the SE yield. Therefore, the number of secondary electrons recorded by the detection system is much lower than for the configuration explained above.

The diagram 550 in the upper partial image of FIG. 5 schematically presents a second exemplary embodiment of a probe 500 that has a detection structure 530. Like in FIG. 4, the probe 500 vibrates above the sample 400. This is elucidated, once again, by the double-headed arrow 410. In the example illustrated in FIG. 5, the detection structure 530 comprises a rectangular structure 530 with two layers, the materials of which have different atomic numbers.

Figure 6:
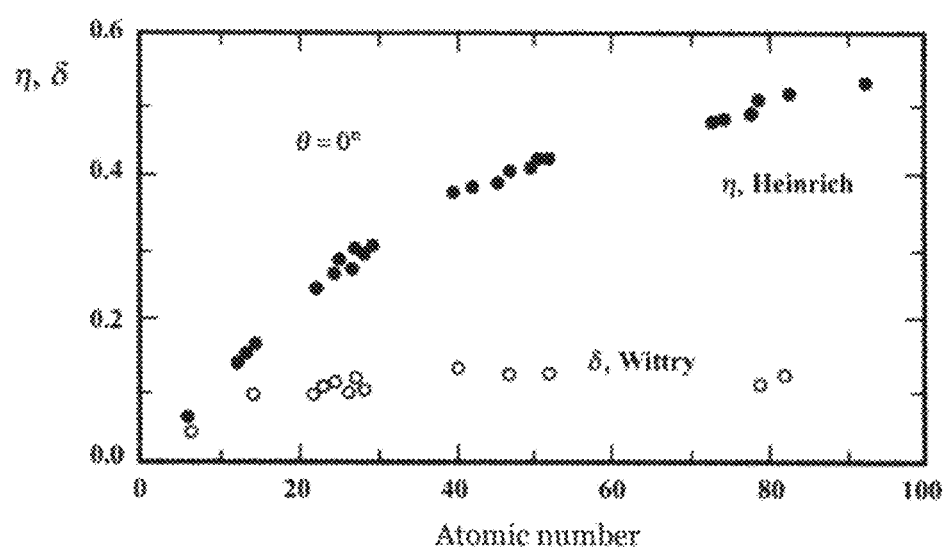
FIG. 6 reproduces the secondary electron yield δ and the backscattered coefficient η as a function of the atomic number.

Firstly, FIG. 6 presents the secondary electron yield δ as a function of the atomic number or proton number. The measurement data for the SE yield δ come from D. B. Wittry: "Optique des rayons X et microanalyse" (eds R. Castaing, P. Deschamps, J. Philibert), Hermann, Paris, p. 185 (1966). Secondly, FIG. 6 reproduces the backscatter coefficient η for backscattered electrons as a function of the atomic number. The measurement data for the backscatter coefficient η have been taken from the contribution "X-Ray Optics and Microanalysis," K. F. J. Heinrich, Proc. 4th Internat. Congress on X-Ray Optics and Microanalysis, eds R. Castaing, P. Deschamps, and J. Philibert, Hermann, Paris, p. 1509 (1966). Both the SE yield δ and the coefficient for the backscattered electrons (BSE) vary as a function of the atomic number. Preferably, materials whose atomic number lies as far apart as possible are used for the detection structure 530 for the purposes of determining the deflection of the probe 500. By way of example, the quotient of the backscatter coefficients is significantly greater than five for a combination of a detection structure 530 made of carbon (Z=6) with one of the metals of tantalum (Z=73), tungsten (Z=74), rhenium (Z=75), osmium (Z=76), indium (Z=77), platinum (Z=78) and gold (Z=79).

Referring back to the diagram 500 in FIG. 5, an electron beam 240 is directed onto a layer of the detection structure 530. The electrons of the electron beam 240 emitted by the detection structure 530 are elucidated by the arrows 560. In the snapshot illustrated in FIG. 5, the probe 500, or the measuring tip 220 thereof, has the closest approach to the sample 400. The electron beam 240 is directed to the layer 533 of the detection structure 530 that has a low atomic or proton number. Within the scope of one period of vibration, the electron beam 240 passes over the detection structure 530 twice and is directed on the layer 536 of the detection structure 530 with the high atomic number at the reversal point with a maximum distance between the probe 500 and the sample 400.

The lower partial image in FIG. 5, or the diagram 590, symbolizes the incidence of the electron beam 240 on the detection structure 530 of the probe 500 at the two extremal points, i.e., reversal points of the movement direction of the measuring tip 220 of the probe 500. In the configuration between the electron beam 240 and the detection structure 530 symbolized by way of the double-headed arrow 560, the electron beam 240 is incident on the layer 536 of the detection structure 530 with a high atomic number and the BSE signal caused by the emitted electrons 560 of the electron beam 240 has a maximum. As explained in the context of the diagram 550 in FIG. 5, the measuring tip 120 of the probe 500 has the maximum distance from the sample 400 at this time.

At the time elucidated by the double-headed arrow 570, the electron beam 240 is directed on the layer 533 of the detection structure 530, the material of which has a low atomic number. The backscatter coefficient η of the electrons 560 of the electron beam emitted by the layer 533 is small and a BSE detector registers only a low signal. The distance of the measuring tip 220 of the probe 500 from the sample 400 is at a minimum at this time.

Figure 7:
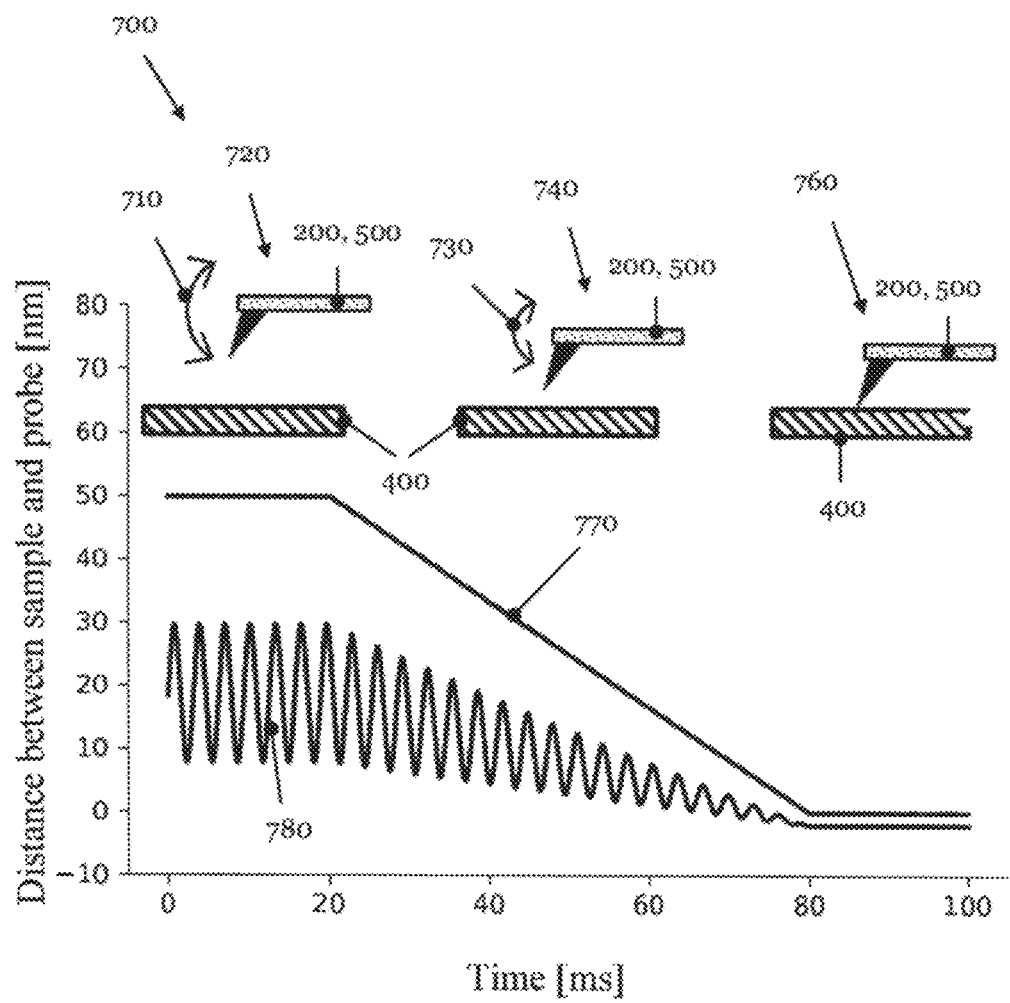
FIG. 7 schematically presents the time profile of an approach process of a probe to a sample surface, together with an associated secondary electron signal.

The diagram 700 in FIG. 7 schematically shows the process of a probe 200, 500 approaching a sample 400, said approach being monitored by irradiating the detection area 230 or the detection structure 530 with an electron beam 240 and detecting the secondary electrons 260 with the detector 290, as explained in the context of FIG. 2, or by detecting the backscattered or emitted electrons 560. The detection area 230 or the detection structure 530 and the electron beam 240 have been suppressed in the diagrams 720, 740 and 760 of FIG. 7 for reasons of clarity.

The diagram 720 represents a free oscillation of the probe 200, 500. The unimpeded vibration of the probe 200, 500 is symbolized by the double-headed arrow 710 in the diagram 720. The solid line 770 presents the time curve of the mean distance of the measuring tip 220 of the probe 200, 500 from the surface of the sample 400. The curve or vibration 780 shows the SE signal 480 of the detector 290 or the BSE signal 580 of the backscattered electrons 560 as a function of time. Typically, the frequency of the unimpeded vibration of the probe 200, 500 lies in a range of 10 Hz to 10 MHz. The vibration frequency lies at 45 kHz in the example illustrated in FIG. 7. Typically, the amplitude of the free vibration of the probe lies in the range of 5 nm to 5 μm. The vibration amplitude is approximately 200 nm in the example of FIG. 7.

The diagram 740 in FIG. 7 presents a configuration in which the mean distance between the measuring tip 120 and the sample 400 is reduced in linear fashion, i.e., the probe 200, 500 is lowered onto the sample 400. As soon as the vibration amplitude of the probe 200, 500 becomes less than twice the mean distance 770, the probe 200, 500 starts to land on the surface of the sample 400 during each vibration period. The portion of time during a vibration period during which the measuring tip 220 is in contact with the sample 400 increases with a vanishing mean distance between the measuring tip 220 of the probe 200, 500 and the surface of the sample 400. The amplitude of the curve 780 starts to reduce as soon as the measuring tip 120 comes into contact with the sample 400 during a vibration period. Should the measuring tip 220 of the probe 200, 500 no longer lift off from the surface of the sample 400, the SE signal 480 or the BSE single 580 vanishes since there substantially no longer is a change in the angle dependence of the SE yield and hence there is no longer a change in the secondary electrons 260 detected per unit time.

The diagram 760 in FIG. 7 finally elucidates the state in which the measuring tip 120 of the probe 200, 500 no longer lifts off from the surface of the sample 400.

Figure 8:
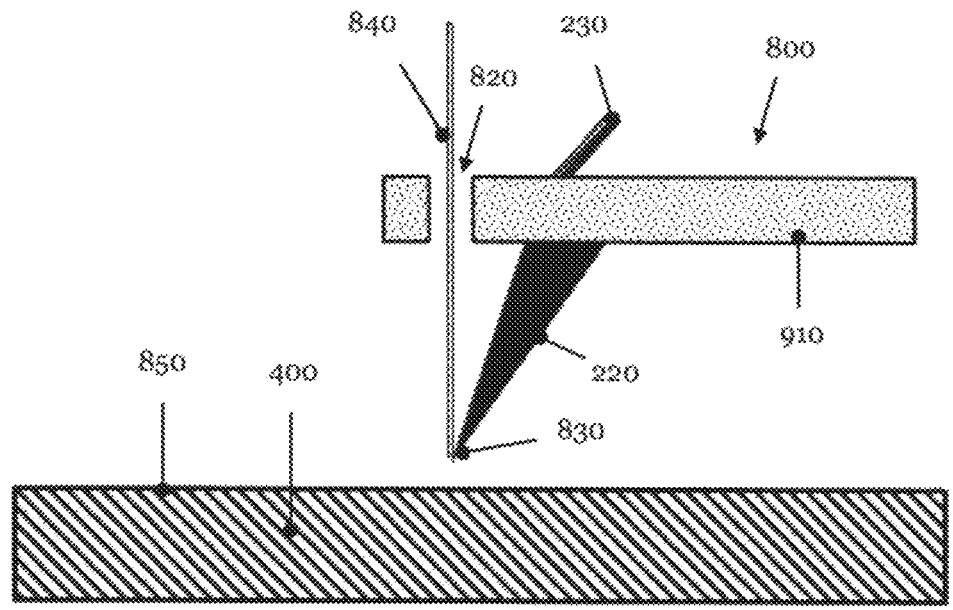
FIG. 8 illustrates a schematic section through a probe over a sample, wherein the cantilever of the probe has a detection area and an opening for the passage of a charged particle beam.

FIG. 8 schematically shows a section through a probe 800 with a cantilever 810 and a measuring tip 220 which, like in FIGS. 2, 4, 5 and 7, was placed pointing obliquely away from the fastening region 130 of the probe 800. The cantilever 810 of the probe 800 has a detection area 230. Further, the cantilever 810 of the probe 800 has an opening 820, through which the electron beam 840 can scan or serve the surface 830 of the sample 400 in the region of the tip 650 of the measuring tip 120. Unlike what was described in the previous exemplary embodiments, a focused electron beam 840 is used to scan the sample surface 830. For the purposes of detecting the SEs 260 and backscattered electrons (BSEs) 560 emitted by the sample 400, use can be made of the detector 290 or a second detector arranged in the column of the scanning particle microscope (not shown in FIG. 8).

A sample 400, for example a photolithographic mask 400, can be electrically insulating or at least comprise electrically insulating regions. Electrically insulating regions can be charged in an electrostatic manner during an irradiation with a charged particle beam, for instance the electron beam 840. As a result, the image produced by the electron beam 840 is distorted. By virtue of the measuring tip 220 and the detection area 230 of the probe 800 not being applied to the free end of the cantilever 810 but the cantilever 810 having an opening 820 in the region of the tip 830 of the measuring tip 220 instead, the cantilever 810 of the probe 800 can largely shield electrostatic charging of the sample surface 830 and thus avoid distorted imaging of the sample 400. For the probe 800 to be able to act as an electrical shielding element, it is necessary for the cantilever 810 of the probe 800 to have an electrically conductive embodiment.

Should the cantilever 810 moreover be designed in such a way that a voltage can be applied thereto, this can be exploited to examine an electrostatically charged sample 400 with the probe 800 of a scanning probe microscope. The electrostatic charging of the sample 400 can be largely compensated by applying a voltage to the cantilever 810 of the probe 800. This facilitates risk-free sensing of the sample 500 by the probe 800. Without compensating the electrostatic charging of a sample 400, arcing can arise between the tip 830 of the measuring tip 120 and the sample 400, as a result of which the measuring tip 120 and/or a sample 400 can be damaged or even irreparably damaged.

Figure 9:
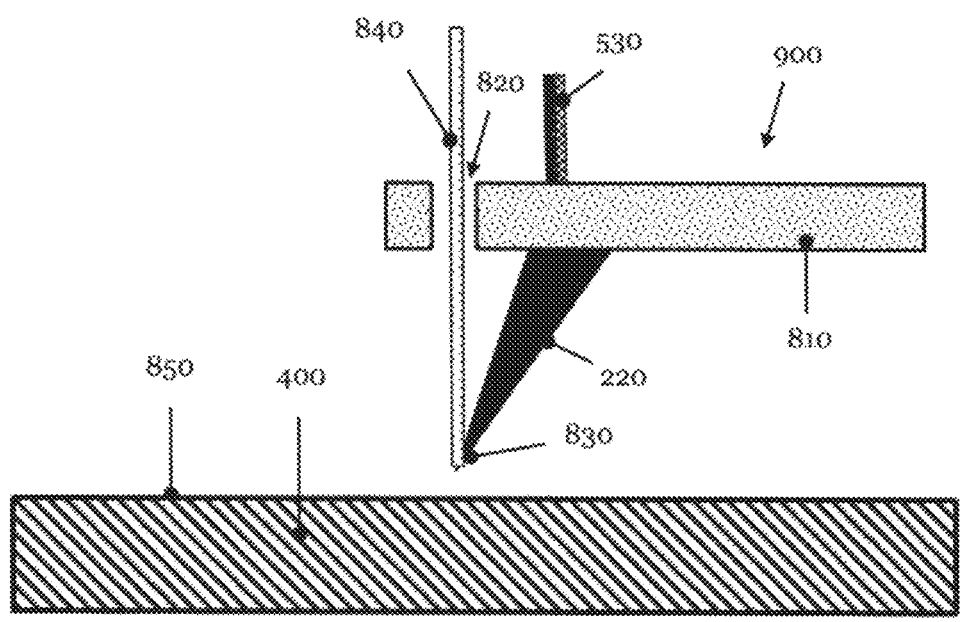
FIG. 9 presents a schematic section through a probe over a sample, wherein the cantilever of the probe has a second exemplary embodiment of a detection structure and an opening for the passage of a charged particle beam.

FIG. 9 reproduces FIG. 8 with the only difference that the probe 900 has the detection structure 530 instead of the detection area 230. The function of the probes 800 and 900 is coupled to the positioning thereof and the measuring tip 220 and is independent of the detection structure 230, 530 for detecting the deflection of the probe 800 and 900. Accordingly, the explanations in respect of FIG. 8 likewise apply to FIG. 9.

Figure 10:
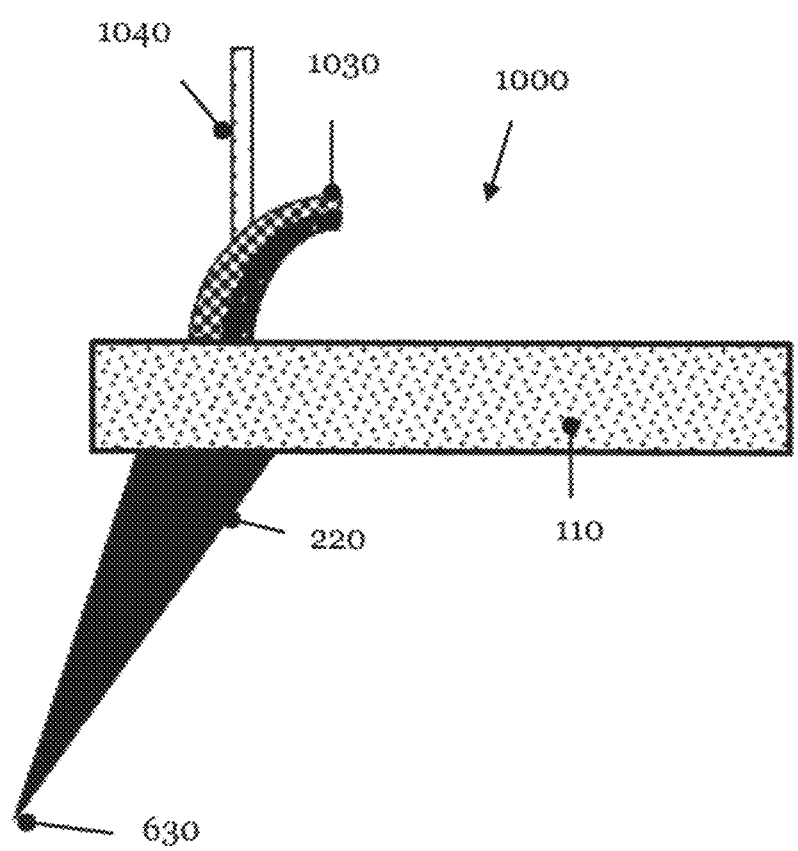
FIG. 10 reproduces a schematic section through a probe, which has a curved detection area.

FIG. 10 reproduces a probe 1000, which has a third exemplary embodiment of a detection structure in the form of a curved detection area 1030. As expressed by Equation (1), the SE yield $\delta(\theta)$ is strongly nonlinearly dependent on the angle $\theta$ at which the electron beam 240 is incident on the detection area 230 of the probe 200. Despite this nonlinearity of the signal of the secondary electrons 260, the movement of the probe 200 can be regulated in the z-direction, i.e., in the vertical direction, in a closed control loop.

In order to simplify closed-loop control of the z-movement of the probe 200, a detection structure can be curved in such a way that the electron beam 1040 approximately always strikes the curved detection area 1030 at the same angle or at approximately the same angle, despite a deflection or vibration of the probe 200. This means that the curvature of the detection area 1030 reproduces the trajectory of the deflection of the probe 1000 in the region of the incidence of the electron beam 240. As a result, a virtually linear relationship arises between the deflection of the probe 1000 and the SE signal measured by the detector 290 on account of the largely compensated angle dependence of the SE yield. However, the translational invariance of the incident electron beam 1040 over the curved detection area 1030 in the longitudinal direction of the probe 1000 must be abandoned as a result of embodying a detection structure in the form of a curved detection area 1030.

Figure 11:
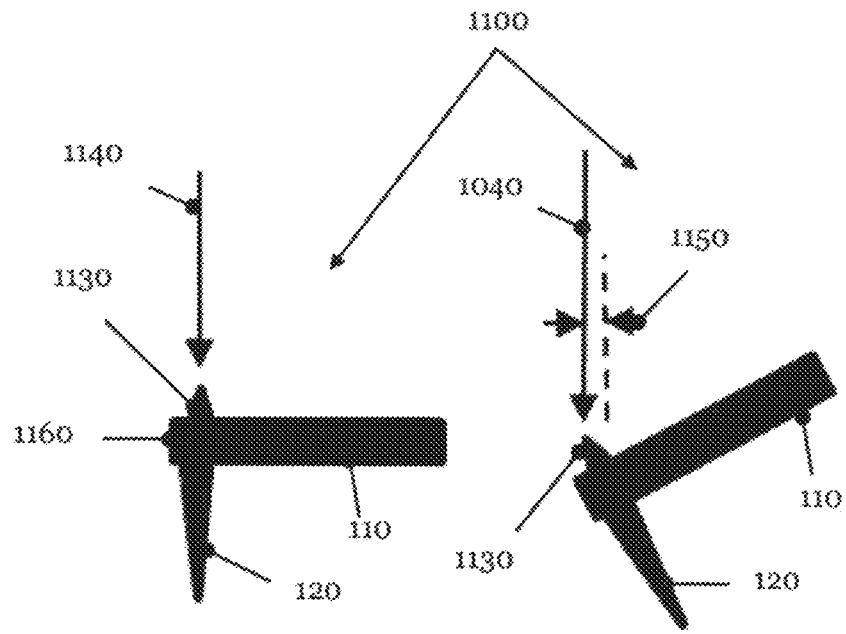
FIG. 11 illustrates a schematic section through a probe in the left partial image, said probe having a further exemplary embodiment of a detection structure in the form of a marking, and elucidates the lateral offset of the marking in the image of the probe in the case of a deflection thereof in the right partial image.

FIG. 11 elucidates a further exemplary embodiment of a detection structure, which renders it possible to detect a deflection of a probe 1100 of a scanning probe microscope with the aid of an electron beam 1140, in general with the aid of a charged particle beam 1140. In the example illustrated in FIG. 11, the detection structure 1130 has a marking 1130 in the form of a tip, which is applied to the surface lying opposite to the measuring tip 120 of the cantilever 110 of the probe 1100. In the example of FIG. 11, the marking 1130 is fastened at substantially the same distance as the measuring tip 120 from the free end 1160 of the cantilever 110 of the probe 1100. However, this is no precondition for the functionality of the marking 1130. However, it is advantageous to attach the marking 1130 in the vicinity of the free end 1160 of the cantilever 110 as this maximizes the detected change of the marking 1130 when deflecting the cantilever 110 of the probe 1100. In order to maximize the contrast of the image of the marking 1130 produced by the electron beam 1140, it is advantageous if a different material is used for the marking 1130 than for the cantilever 110 of the probe 1100.

The right partial image in FIG. 11 schematically shows the lateral displacement 1150 of the marking 1130 of the probe 1100 as a consequence of the deflection of the probe 1100. It is possible to determine the deflection of the probe 1100 from the lateral displacement 1150 of the marking 1130 during imaging with an electron beam 1140. Unlike in the use of the detection areas 230, 1030 for ascertaining the deflection, the electron beam 1140 is preferably guided over the region of the probe 1100 having the marking 1130 in a focused manner for the purposes of imaging the marking 1130 by a scanning electron microscope.

Figure 12:
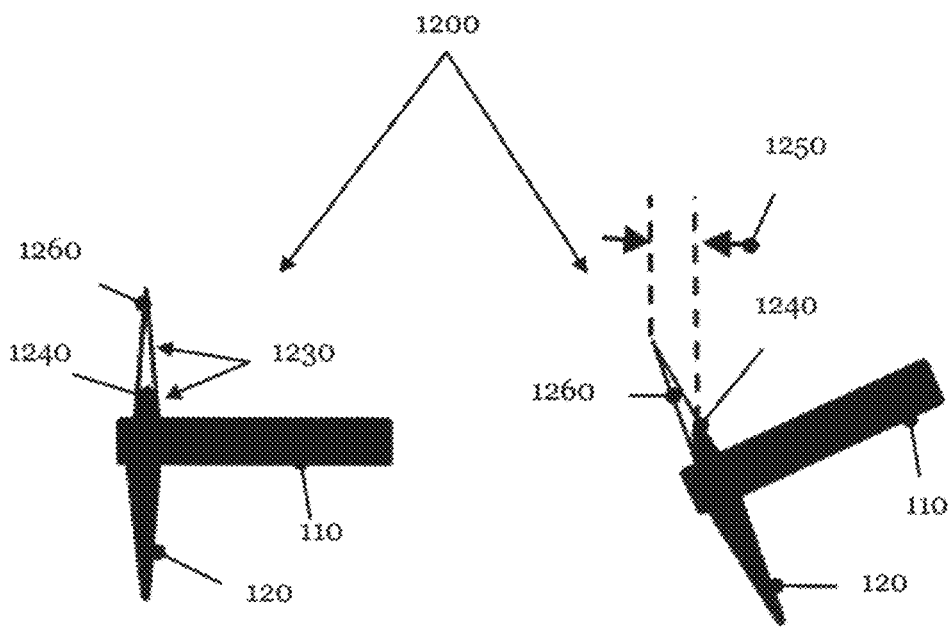
FIG. 12 reproduces FIG. 11, wherein the detection structure is embodied in the form of two markings with different heights.

FIG. 12 presents a probe 1200 which has a detection structure 1230 in the form of two markings 1240 and 1260. The two markings 1240 and 1260 are once again embodied in the form of a tip, although said tips have different heights. In the example of FIG. 12, the markings 1240 and 1260 are attached along one line on the probe 1200, said line being perpendicular to the longitudinal axis of the probe 1200. This arrangement is no precondition for the functionality of the markings 1240 and 1260, although it simplifies the evaluation of the measurement signals in the case of a lateral displacement of the markings 1240 and 1260 as a consequence of a deflection of the probe 1200 during the imaging thereof by the electron beam 1140.

The right partial image of FIG. 12 reproduces the lateral displacement 1250 of the two markings 1240 and 1260 of different heights. In contrast to the exemplary embodiment with only one marking 1130 specified in FIG. 11, the probe 1200 with the two markings 1240 and 1260 allows a different measurement to be carried out for the purposes of determining a deflection of the probe 1200 in the image of the two markings 1240 and 1260. This increases the measurement accuracy of determining the deflection of the probe 1200 in comparison with the probe 1100 in FIG. 11.

Figure 13:
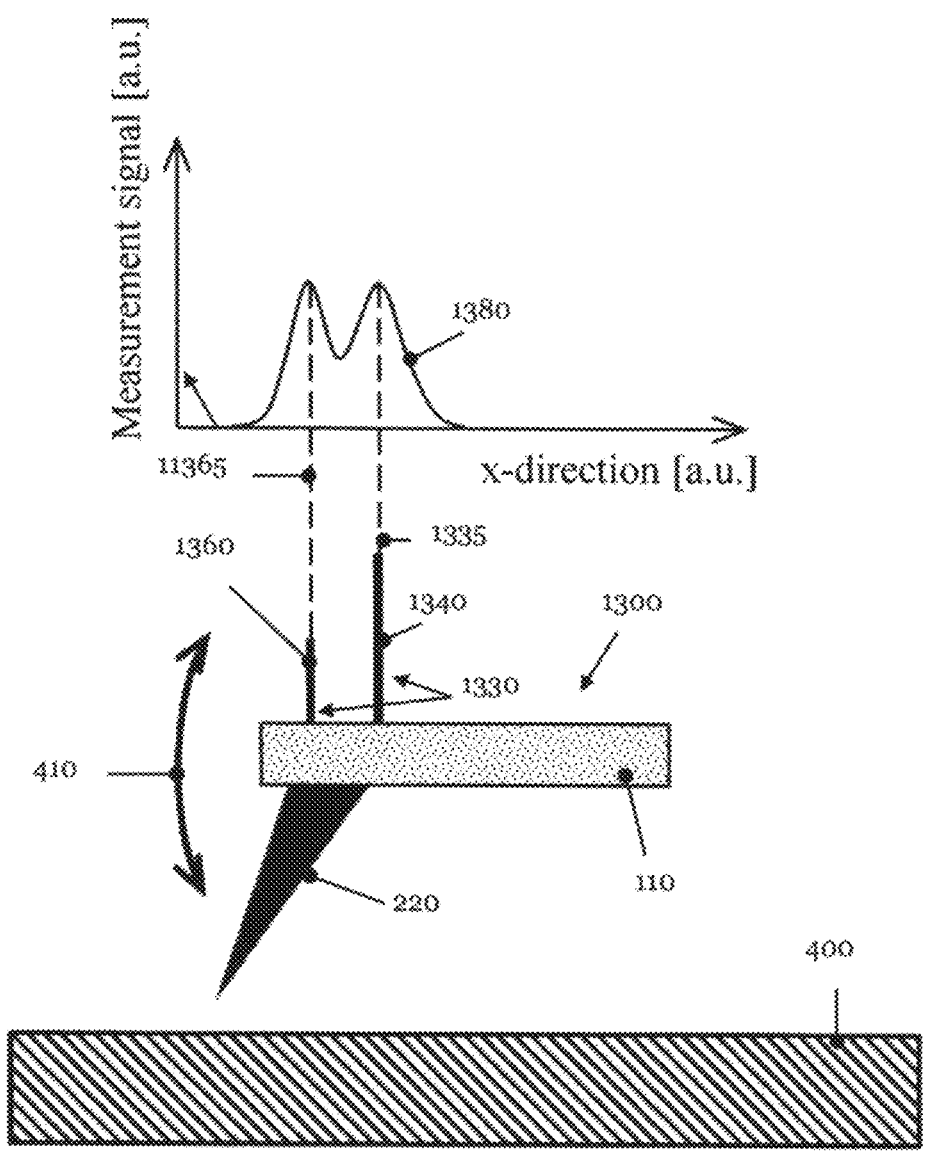
FIG. 13 specifies a further exemplary embodiment of a detection structure in the form of two areal elements, arranged transversely with respect to the longitudinal axis at a distance from one another along the longitudinal axis of the probe, in the lower partial image and presents the measurement signal in the case of a line scan of a charged particle beam over the two areal elements along the longitudinal axis of the probe in the upper partial image.

FIG. 13 reproduces a further exemplary embodiment of a detection structure 1330, which renders it possible to detect a deflection of a probe 1300 of a scanning probe microscope with the aid of an electron beam, in general with the aid of a charged particle beam. Just like in subsequent FIG. 14, the electron beam has not been illustrated in FIG. 13. In the example specified in FIG. 13, the detection structure 1330 has two rectangular elements 1340 and 1360, which are applied to the surface 115, or top side 115, lying opposite to the measuring tip 220 of the cantilever 110 of the probe 1300. The rectangular elements 1340, 1360 extend over the larger part of the width of the probe 1300. The surface normals of the rectangular elements 1340, 1360 are substantially parallel to the longitudinal axis of the probe 1300 or to the cantilever 110. The two rectangular elements 1340, 1360 have different heights in the example of FIG. 13. However, this property is not necessary for the function thereof as a detection structure 1330. Further, elements 1340 and 1360 that have any thin or sheet-shaped structure can be used to produce a detection structure 1330.

Preferably, the rectangular, generally sheet-shaped elements 1340, 1360 have a material composition that differs from that of the cantilever 110 or the surface thereof. As a result, the electrons of an electron beam additionally produce a material contrast in addition to the topology contrast. Materials with a high atomic number are preferable for the rectangular or sheet-shaped elements 1340, 1360. This applies, in particular, if backscattered electrons are used to detect the detection structure 1330 in the form of the elements 1340 and 1360. However, it is also possible to produce the rectangular or sheet-shaped elements 1340, 1360 to the greatest part by depositing carbon. Secondary electrons can be used for detecting the detection structure 1330 in the form of the elements 1340 and 1360 in this embodiment. A line scan of an electron beam or of a charged particle beam in the direction of the longitudinal axis of the probe 1300 is sufficient for detecting the two elements 1340 and 1360.

The upper partial image in FIG. 13 presents the measurement signal in the case of a line scan over the two elements 1340, 1360 of the detection structure 1330. As already explained above, secondary electrons 260 and/or backscattered electrons 560 can be used to detect the detection structure 1330. The curve 1380 of the measurement signal in each case shows a peak when the electron beam senses the elements 1340 and 1360 of the detection structure 1330 during a line scan. In the upper partial image in FIG. 13, the two peaks have substantially the same height since the material composition of the rectangular or sheet-shaped elements 1340 and 1360 is substantially the same. However, this is no precondition for the function of the detection structure 1330. Rather, the two elements 1340 and 1360 of the detection structure 1330 can be manufactured from different materials.

Figure 14:
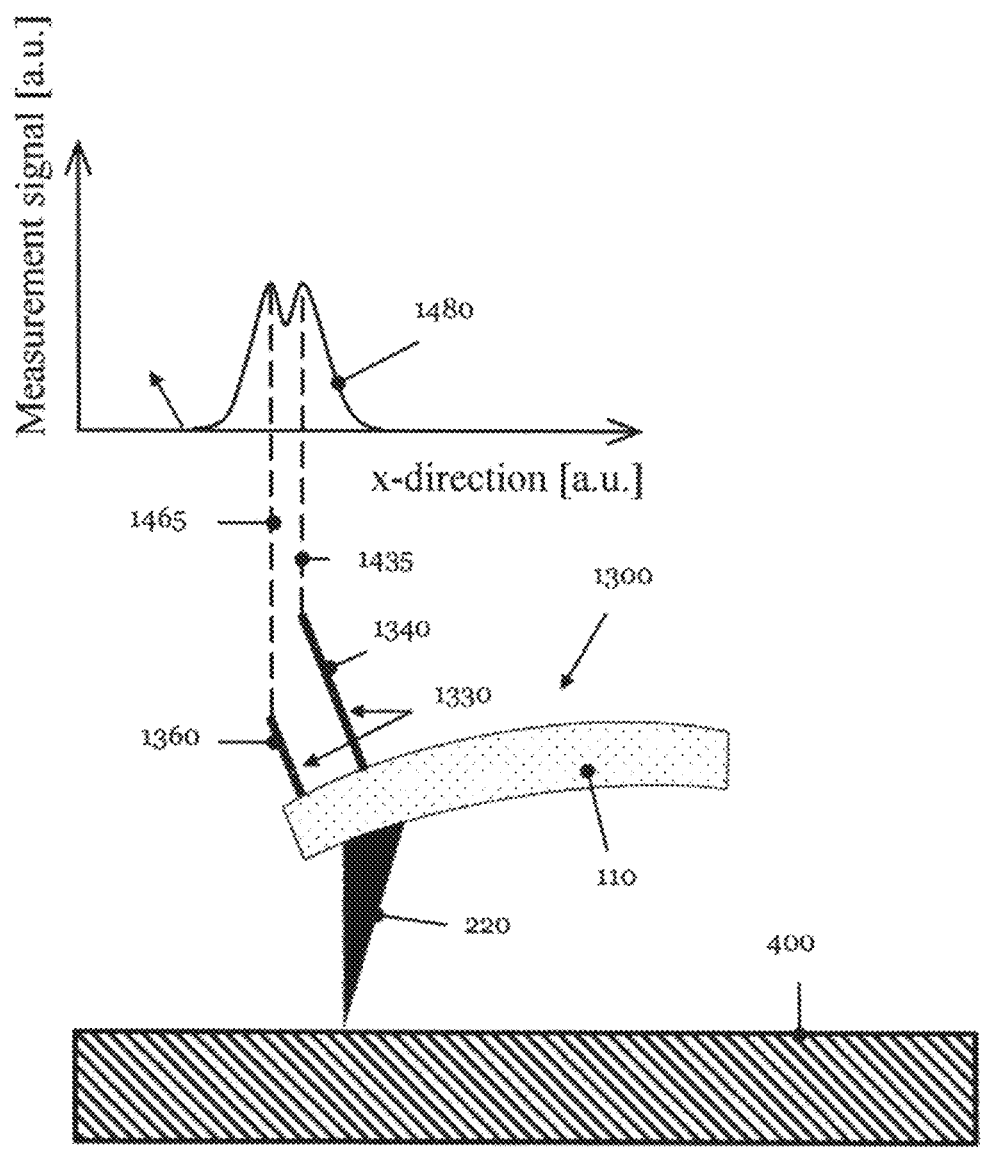
FIG. 14 reproduces FIG. 13 at the time when the measuring tip of the probe touches the surface of the probe.

The lower partial image in FIG. 13 shows a snapshot of the vibrating probe 1300 during its zero crossing. FIG. 14 reproduces FIG. 13 at the time at which the measuring tip 120 of the probe 1300 has the closest approach to the sample 400. In most modes of operation of a scanning probe microscope, the measuring tip 120 is in mechanical contact with the surface 650 of the probe 400 at this time. As a result of the curvature of the probe 1300 or of the cantilever 110 thereof, a line scan of an electron beam in the longitudinal direction of the cantilever 110 detects an apparent spacing between the two elements 1340 and 1360 that is less than in FIG. 13. Hence, the detection structure 1330 allows the detection of a deflection of the probe 1300 and hence the examination and/or the processing of the sample 400 with the probe 1300 of a scanning probe microscope. An advantage of the detection structure 1330 is that it requires no reference measurement on account of the two rectangular or sheet-shaped elements 1340 and 1360.

Figure 15:
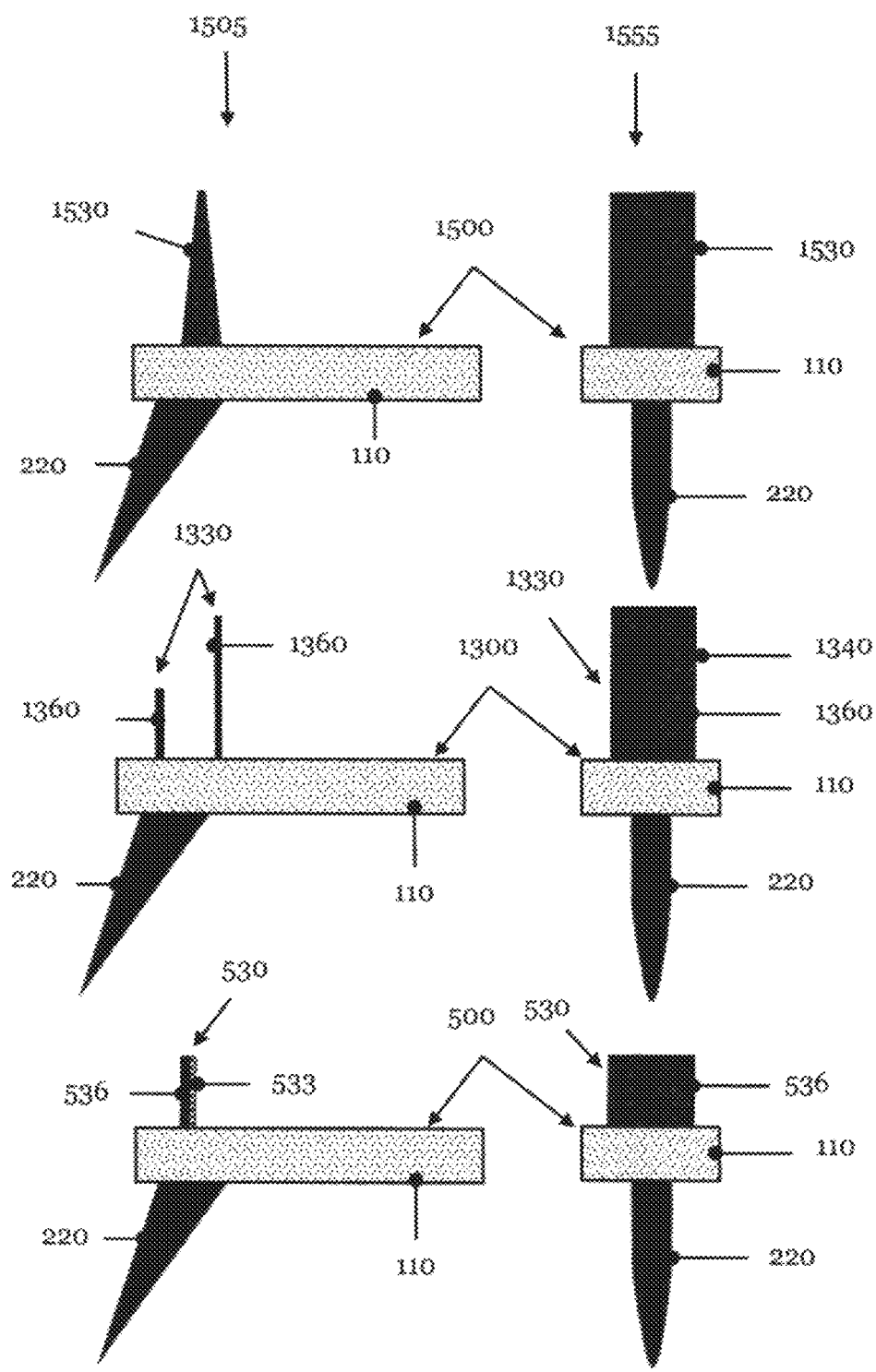
FIG. 15 schematically illustrates side and front views of various exemplary embodiments of detection structures in the form of rectangular elements.

The two lower left partial images 1505 in FIG. 15 show side views of the already discussed probes 500 and 1300. The two lower right partial images 1555 reproduce front views of the probes 500 and 1300. Additionally, the left upper partial image 1505 presents a side view of a probe 1500 and the right upper partial image 1555 presents a front view of the probe 1500 with a detection structure 1530 on the front-side surface 115 of the probe 1500. The detection structure 1530 has a rectangular element, which extends over the majority of the width of the probe 1500. The rectangular element of the detection structure 1530 tapers towards the top. As already explained above in the context of FIG. 13, it is advantageous if there is a difference in the material composition of the detection structure 1530 of the probe 1500 and of the cantilever 110 of the probe 1500. Unlike the detection structure 1330 in FIG. 13, the detection structure 1530 of FIG. 15 in the form of a single rectangular element requires a reference measurement in order to detect a deflection of the probe 1500 from the displacement of the peak of a measurement signal of SE and/or BSE electrons caused by the detection structure 1530.

Figure 16:
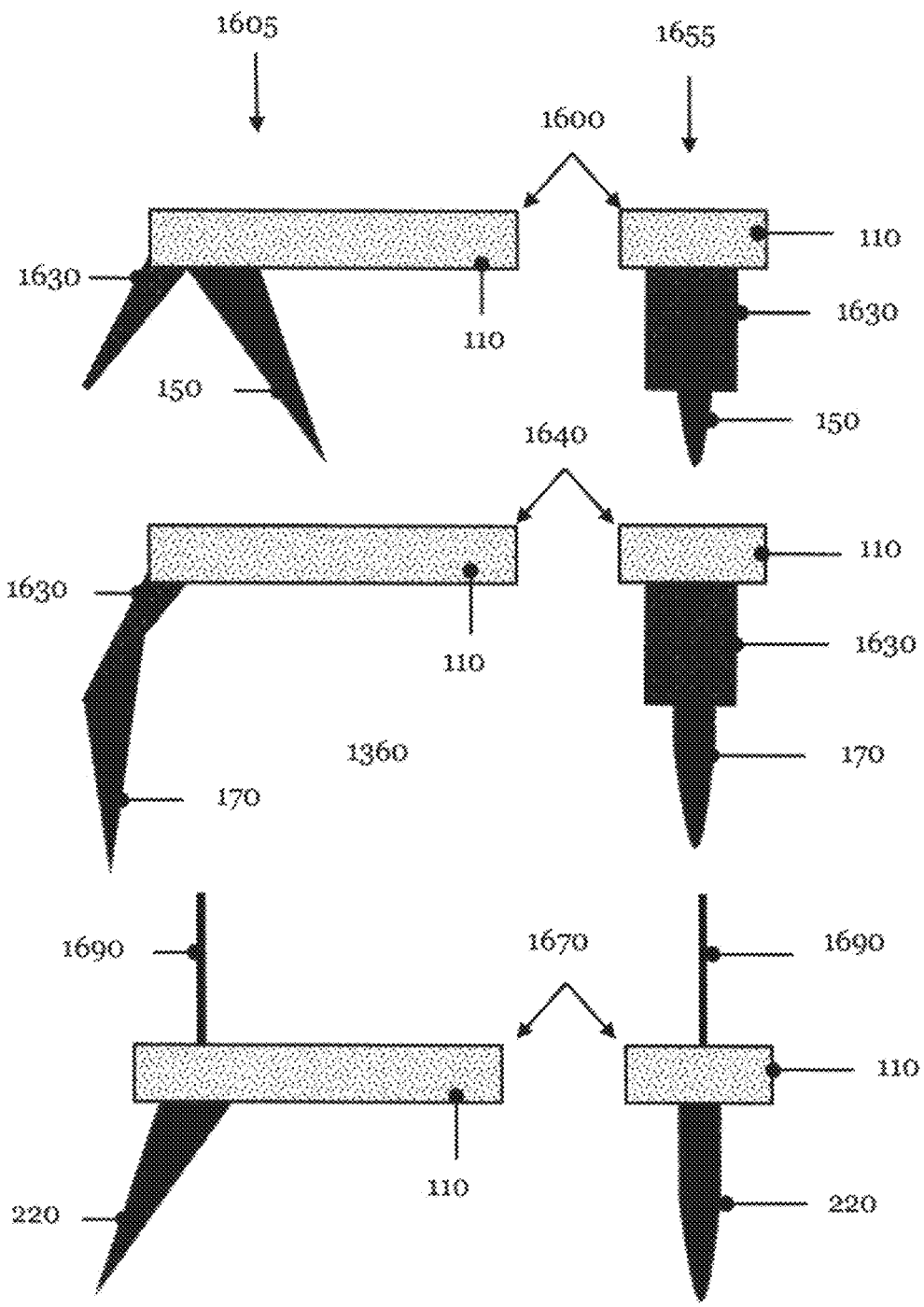
FIG. 16 schematically elucidates side and front views of further exemplary embodiments of detection structures in combination with various measuring tips of probes.

FIG. 16 elucidates further exemplary embodiments of detection structures 1630 and 1690. Similarly to FIG. 15, the left partial images 1605 present side views and the right partial images 1655 provide front views of the probes 1600, 1640 and 1670. In the case of the probe 1600 of the upper partial image, the measuring tip 150, unlike the measuring tips 220, points toward the holding plate 130 of the probe 1600. The rectangular detection structure 1630 is applied to the same surface 125 as the measurement tip 150. This configuration simplifies the production of the probe 1600 in comparison with the previously discussed embodiments of the probes 200, 500, 800, 900, 1000, 1100, 1200, 1300, 1500. As a result of placing the detection structure 1630 at an angle, a line scan in the longitudinal direction of the probe 1600 yields a broad maximum of the measurement signal of secondary and/or backscattered electrons. The width of the measurement signal varies periodically with the vibration frequency of the probe 1600.

In the configuration reproduced in the central partial images 1605 and 1655, the detection structure 1630 reproduced in the upper partial images is deposited on the cantilever 110 of the probe 1640. Thereupon, the measuring tip 170 for the probe 1640 is deposited on the detection structure 1630. Unlike the measuring tips 220 and 150, the measuring tip 170 stands substantially perpendicular on the back-side surface 125 of the cantilever 110 of the probe 1640. Like for the probe 1600, the measuring tip 170 and the detection structure 1630 are attached on the lower side 125 of the cantilever 110 of the probe 1640 for the probe 1640, simplifying the production of the probe 1640. Moreover, the configuration of the probe 1640 is advantageous since the lower side 125 of the cantilever 110 has a large distance from the surface 650 of the sample 400.

The lower partial images 1605 and 1655 in FIG. 16 once again present an exemplary embodiment of a probe 1670, in which a measuring tip 120 is attached to the back side 125 of the cantilever 110 of the probe 1670. On the front side 115, the cantilever 110 of the probe 1670 has a rod-shaped detection structure 1690. In place of a rod-shaped detection structure 1690, the probe 1670 can have detection structures that are embodied in other forms. By way of example, the detection structure 1690 can be embodied in the form of a cylinder or in conical form (not illustrated in FIG. 16). Moreover, it is possible to embody the detection structure 1690 with any contour. Unlike the detection structure 1630, the detection structure 1690 is imaged by way of a planar scan over the front side 115 of the cantilever 110 of the probe 1670.

Figure 17:
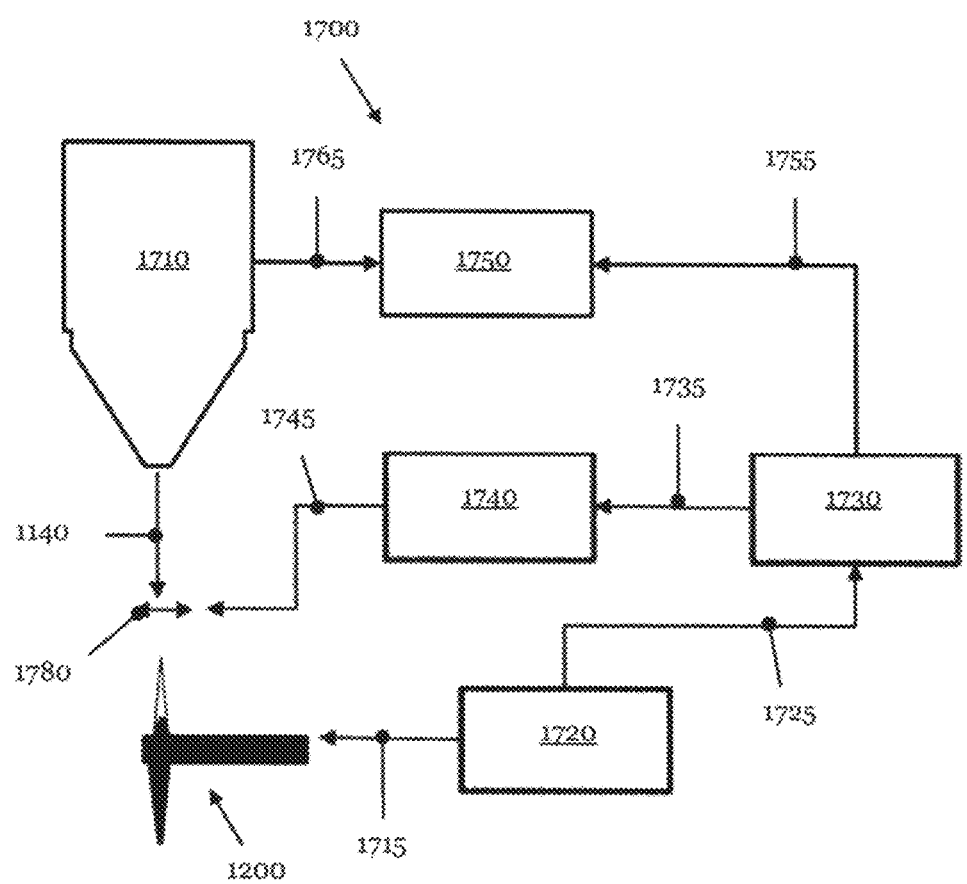
FIG. 17 illustrates a section through a signal processing unit for a scanning particle microscope and the connections thereof to the probe drive of a scanning probe microscope and to the generator of the scan signal for the beam of charged particles of the scanning particle microscope.

The diagram 1700 in FIG. 17 schematically shows a section through an apparatus that can be used to measure an excitation of the vibration of the probe 800, 900, 1670 during a scanning process. The core of the apparatus is the signal processing unit 1750. Via the connection 1765, the latter receives measurement data of the scanning electron microscope 1710. The signal processing unit 1750 slows down the measurement data of the scanning electron microscope 1710 by use of equivalent time sampling (ETS). This means the measurement signal of the probe 800, 900, 1670 is recorded at a very much lower frequency than the vibration frequency of the probe 800, 900, 1670. To this end, the signal processing unit 1750 has a gated integrator and/or a boxcar averager.

The probe drive 1720 excites the probe 500, 800, 900, 1000, 1100, 1200, 1300, 1500, 1600, 1640, 1670 to vibrate via the connection 1715. In the example illustrated in FIG. 17, this is the probe 1200. The probe drive 1720 forwards the excitation frequency to the retardation unit 1730 via the connection 1725. The retardation unit 1730 forwards a trigger signal to the deflection generator 1740 via the connection 1735, said deflection generator controlling the scanning 1780 of the electron beam 1140 over the markings 1240, 1260 over the detection structure 1230 via the connection 1745.

Figure 18:
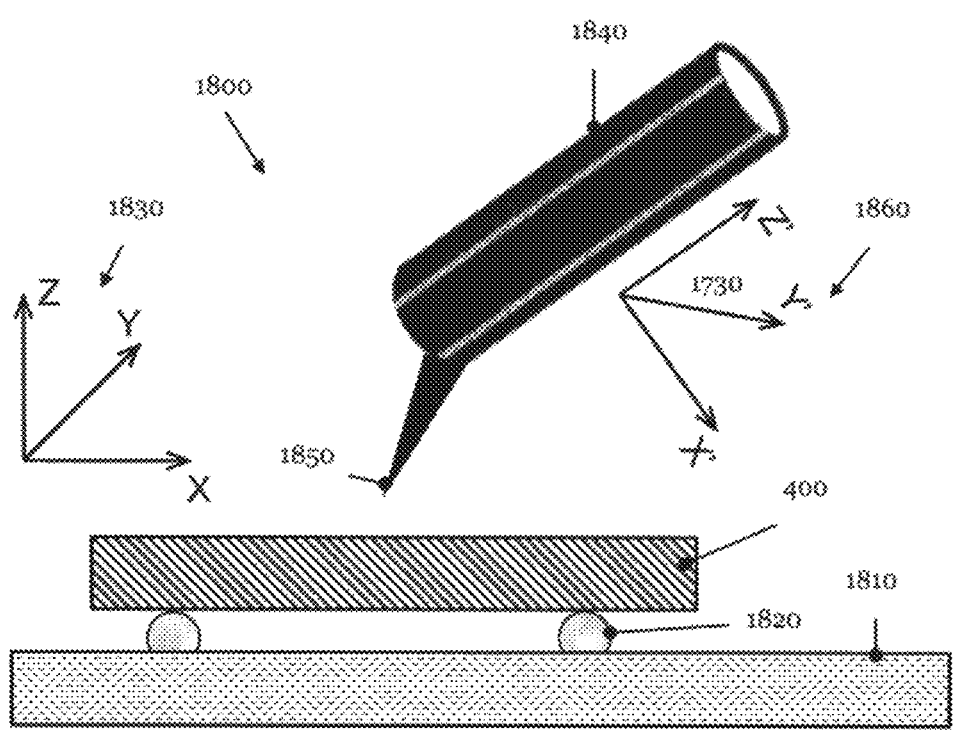
FIG. 18 schematically illustrates a nano-manipulator, the coordinate system of which is rotated with respect to the coordinate system of the sample stage.

As a rule, scanning probe microscopes are constructed in such a way that the coordinate system of the piezo-actuator and the coordinate system of the sample stage 1110 are aligned with respect to one another. However, this is often not possible on account of the restricted space when combining a scanning particle microscope and a scanning probe microscope or a nano-manipulator. The diagram 1800 in FIG. 18 shows a sample stage 1810 with supports 1820 for holding a sample 400. The coordinate system of the sample stage 1810 is represented by the reference sign 1830. The sample 400 is processed by the tip 1850 of the processing head 1860 of the nano-manipulator 1840. On account of the limited space as a result of the scanning particle microscope, which is not illustrated in FIG. 18, the coordinate system 1870 of the nano-manipulator 1840 is rotated in relation to the coordinate system 1830 of the sample stage 1810. In order to carry out a fast coordinate transformation between the two coordinate systems 1830 and 1870, the control unit of the nano-manipulator 1840 can be equipped with an ASIC (application-specific integrated circuit), for example, which can carry out a coordinate transformation between the coordinate systems 1830 and 1870 in less than 10 µs. In an alternative embodiment, the coordinate transformation between the coordinate systems 1830 and 1870 can be carried out by use of analogue electronics. In both embodiments, the transformation time for the coordinate transformation is short enough in order not to delay, or not to substantially delay, the control signal of a probe operated in a closed control loop.

Figure 19:
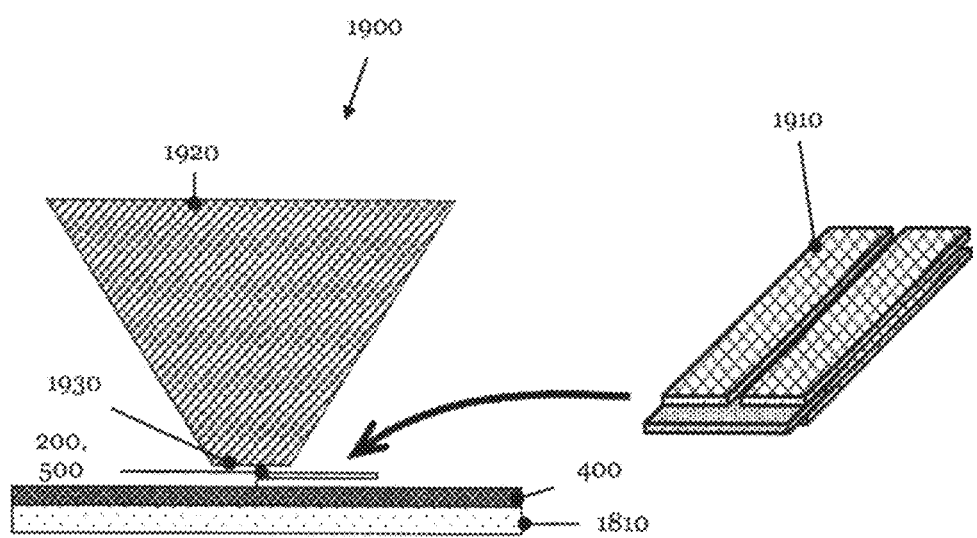
FIG. 19 schematically shows the use of a quad-morph piezo-actuator for positioning and deflecting a probe between an outlet opening of the coil of a scanning electron microscope and a sample.

FIG. 19 shows a further option for exploiting the limited amount of space in the case of the combination of a scanning particle microscope and a scanning probe microscope to the best possible extent. Typically, a probe 100, 200, 500, 800, 900, 1000, 1100, 1200, 1300, 1500, 1600, 1640, 1670 of a scanning probe microscope is positioned with the aid of a tube-shaped piezo-actuator. By way of example, the processing head 1860 of the nano-manipulator 1840 in FIG. 18 likewise has a tube-shaped piezo-actuator. However, the tube shape is disadvantageous for the use in a nano-manipulator 1840 or scanning probe microscope if these appliances should be combined with a scanning probe microscope. As elucidated in FIG. 19, the column 1920 of a scanning particle microscope restricts the space between the sample 400 and the outlet opening 1930 of the column to a few millimeters. If a quad-morph piezo-actuator 1910 is used instead of a tube-shaped piezo-actuator, the space between the sample 400 and the column 1920 can be exploited in optimal fashion.

Figure 20:
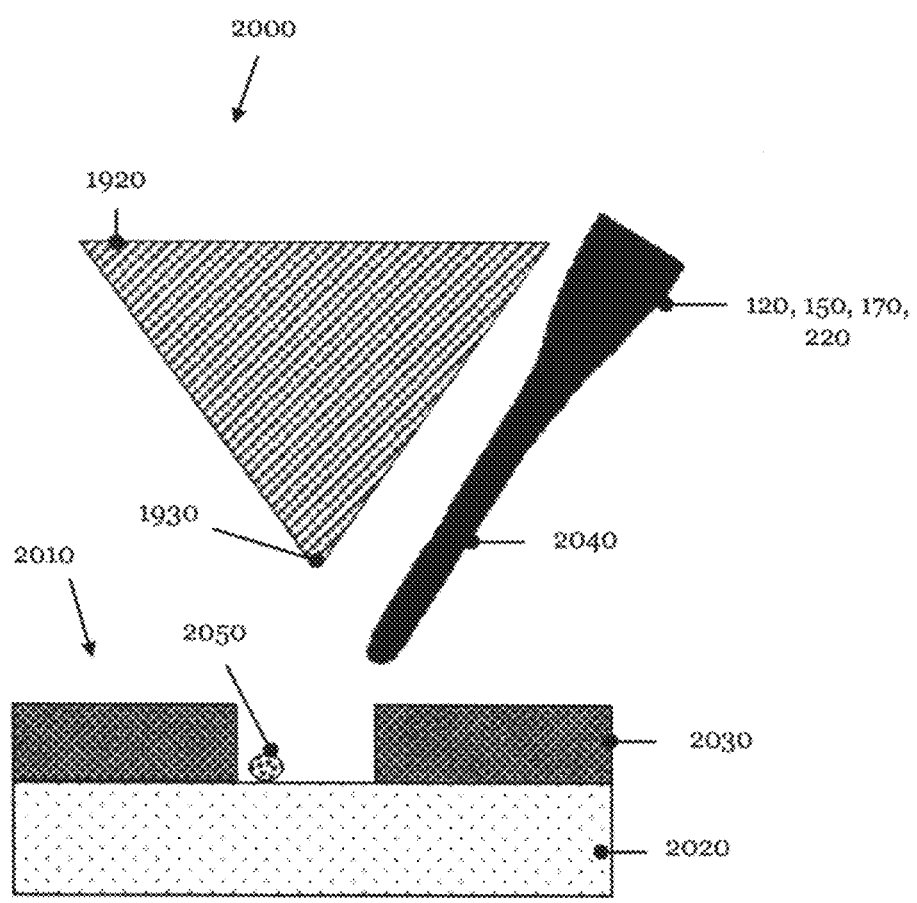
FIG. 20 reproduces a schematic section through a sacrificial tip, which is attached to a measuring tip of a probe and positioned under the outlet opening of the column of a scanning electron microscope in the vicinity of a particle present on a photomask.

FIG. 20 elucidates the processing of a sample under the aggravated spatial conditions of an apparatus that combines a scanning particle microscope and a scanning probe microscope or a nano-manipulator 1840 under the additional condition that the interaction areas of the two microscopes overlap on the sample. In the diagram 2000 in FIG. 20, the sample is a photolithographic mask 2010 comprising a substrate 2020 and absorbing pattern elements 2030. A particle 2050 impairing the imaging properties of the mask 2010 is present on the substrate 2020 of the mask 2010. The outlet opening 1930 of the column 1920 of a scanning particle microscope is schematically illustrated above the mask 2010.

In the example illustrated in FIG. 20, a sacrificial tip 2040 has been deposited (not illustrated in FIG. 20) on the measuring tip 120, 150, 170, 220 of the probe 100, 200, 500, 800, 900, 1000, 1100, 1200, 1300, 1500, 1600, 1640, 1670 or on the tip 1850 of the nano-manipulator 1840. The sacrificial tip 2040 can have been deposited with the aid of a charged particle beam, for example an electron beam, under the provision of a precursor gas on the measuring tip 120, 150, 170, 220 or the tip 1850. Carbon-containing precursor gases or metal carbonyls can be used as precursor gases.

Figure 21:
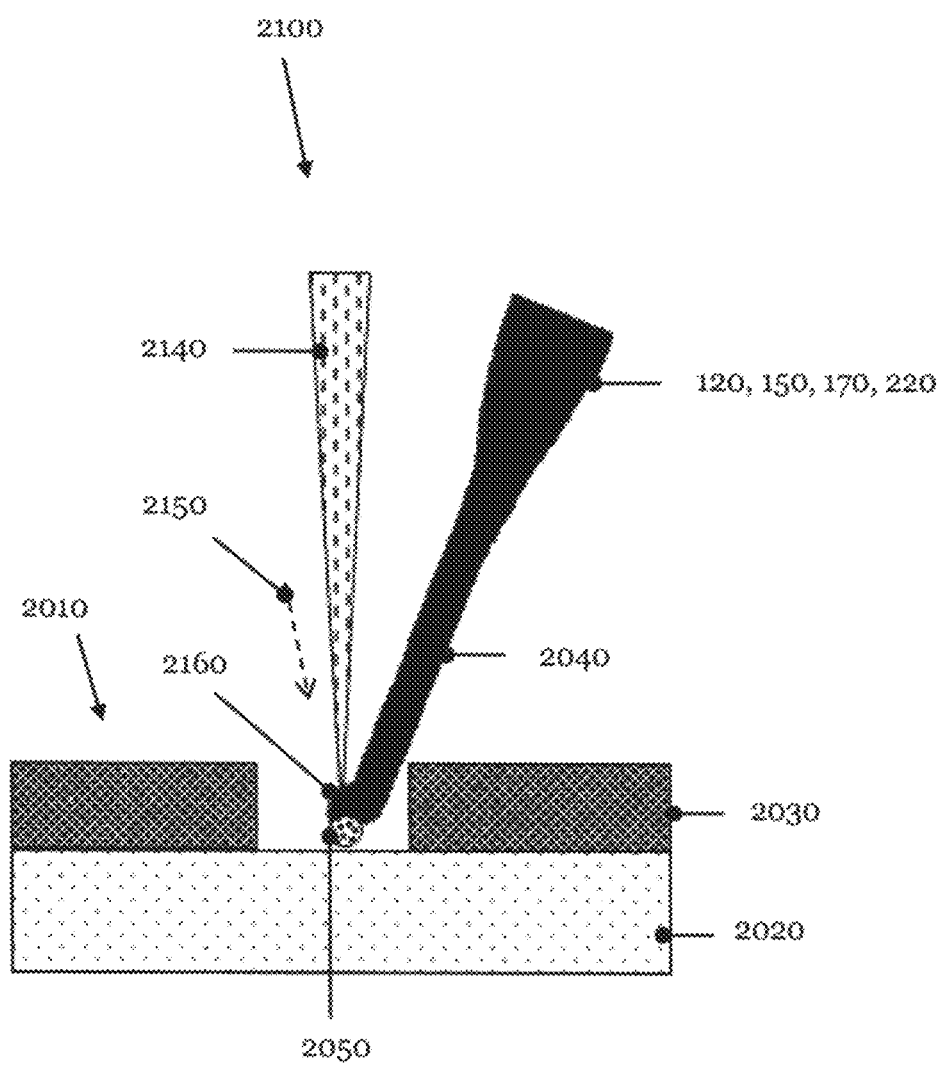
FIG. 21 schematically elucidates how the particle of FIG. 20 is connected to the sacrificial tip by carrying out a local deposition process.

FIG. 21 repeats the configuration of FIG. 20 after the sacrificial tip 2040 has been positioned in the vicinity of, or on, the particle 2050. For reasons of clarity, the column 1920 has been omitted from FIG. 21. A precursor gas 2150 is provided in the region of the particle 2050 after the positioning processes of the sacrificial tip 2040 has been completed. This is elucidated by the dashed arrow in FIG. 21. Additionally, an electron beam 2140 is provided in the region of the particle 2050, said electron beam triggering a local deposition process of material 2160 on the particle 2050 and the tip of the sacrificial tip 2040.

Figure 22:
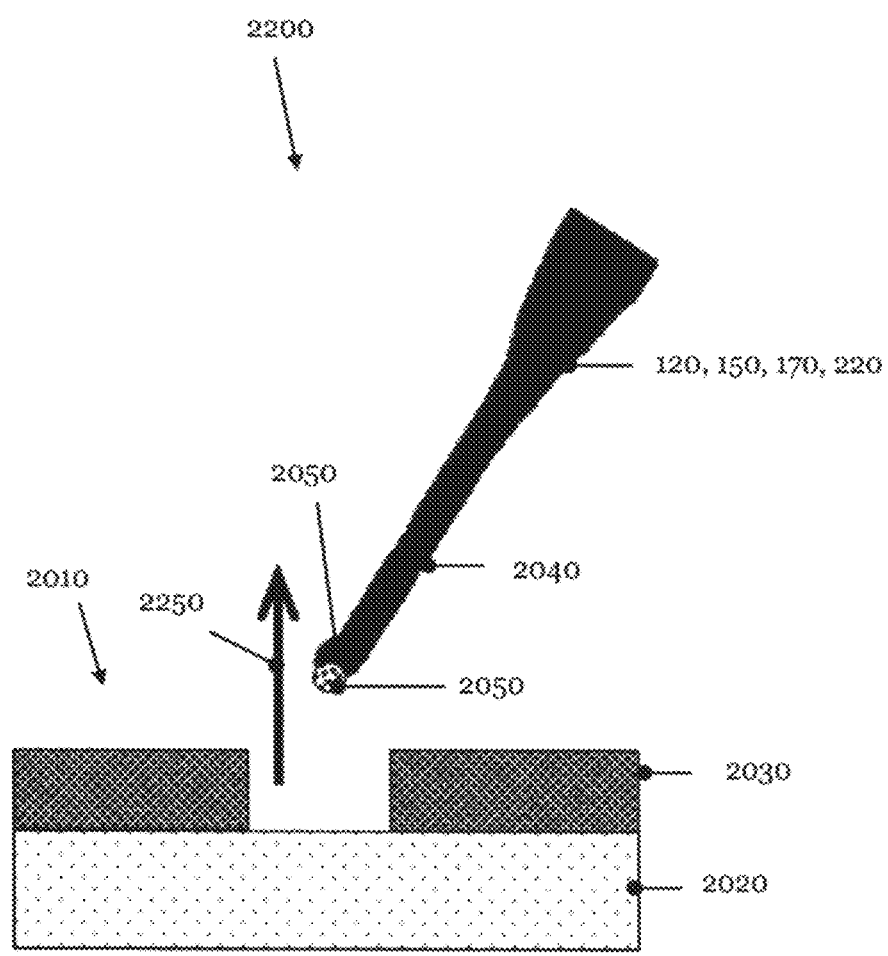
FIG. 22 schematically illustrates the process of removing the particle connected to the sacrificial tip from the photomask.

The particle 2050 is removed from the substrate 2020 of the mask 2010 by moving the probe 100, 200, 500, 800, 900, 1000, 1100, 1200, 1300, 1500, 1600, 1640, 1670 or the nano-manipulator 1840 after the particle 2050 has been connected to the tip of the measuring tip 2040. The diagram 2200 in FIG. 22 illustrates this step by the arrow 2250.

Figure 23:
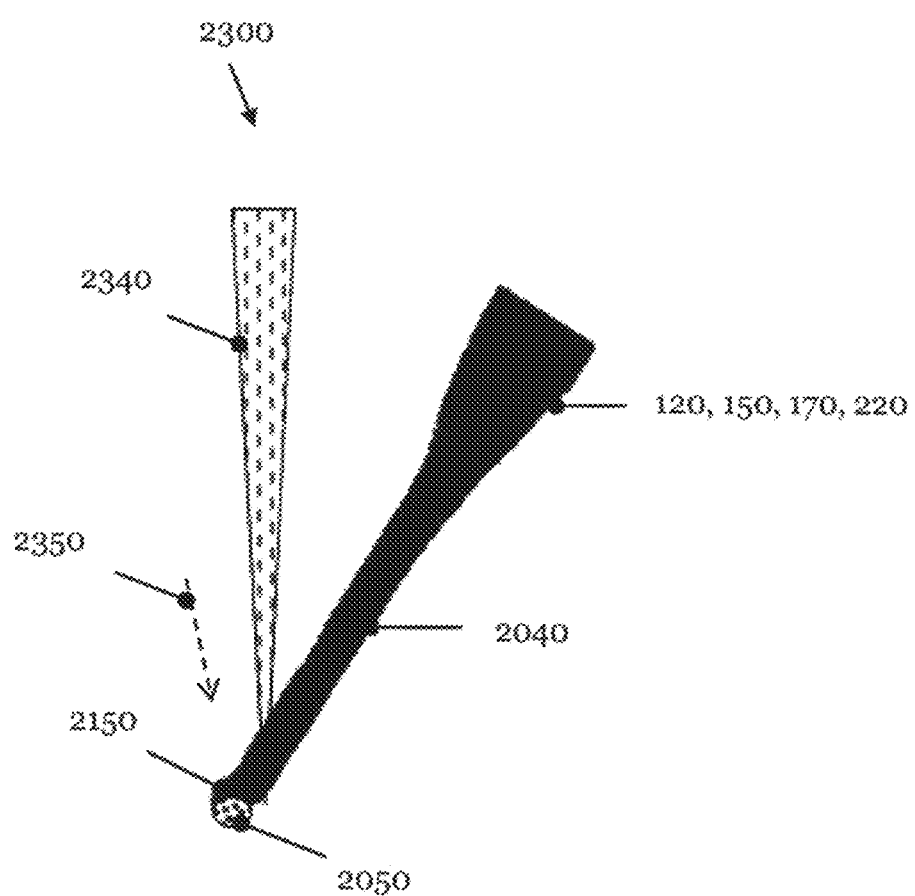
FIG. 23 schematically reproduces how the particle is separated from the sacrificial tip by carrying out a local etching process.

An advantage of the sacrificial tip 2040 having been deposited on the measurement tip 120, 150, 170, 220 or the tip 1850 is that the particle 2050 removed from mask 2010 can be removed from the sacrificial tip 2040 in an EBIE (electric beam induced etching) process. FIG. 23 elucidates the removal of the particle 2050 from the sacrificial tip 2040 by use of the electron beam 2340 and the etching gas 2350 (symbolized by the dashed arrow).

After completion of the EBIE process, the sacrificial tip 2040, which has only been modified slightly, is available for removing further particles. Before the particle 2050 is removed from the sacrificial tip 2040, the material composition of the particle 2050 can be determined by irradiation with the electron beam 2340 and analysis of the x-ray radiation emitted by the particle 2050 in an energy-dispersive detector.

Figure 24:
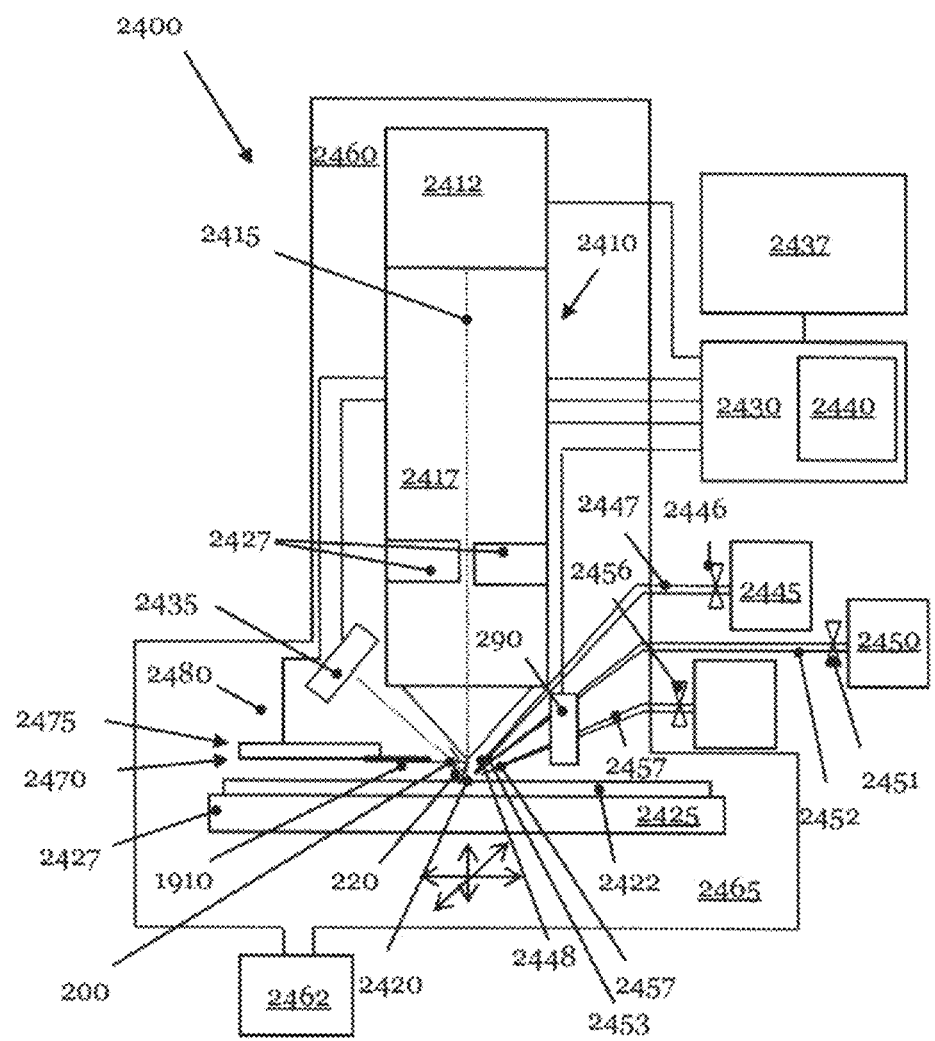
FIG. 24 illustrates a section through a combination of a scanning electron microscope and an atomic force microscope.

FIG. 24 shows a schematic section through a few important components of an apparatus 2400, by means of which a sample 400 or a photolithographic element 2010 can be examined and/or processed. A probe 200, 500, 800, 900, 1000, 1100, 1200, 1300, 1500, 1600, 1640, 1670 with a detection structure 230, 530, 1030, 1130, 1230, 1330, 1530, 1630, 1690 can be installed and used in the apparatus 2400. The apparatus 2400 comprises a modified scanning particle microscope 2410 in the form of a scanning electron microscope (SEM) 2410 and a scanning probe microscope 2470 in the form of an atomic force microscope (AFM) 2470.

In the SEM 2410 of FIG. 24, an electron gun 2412 produces an electron beam 2415, which is directed as a focused electron beam onto the position 2420 on the sample 2422 that can comprise the sample 400 or a mask 2010 by the imaging elements, not illustrated in FIG. 24, arranged in the column 2417. The sample 2422 is arranged on a sample stage 2525 (or stage). Further, the imaging elements of the column 2417 of the SEM 2410 can scan the electron beam 2415 over the sample 2422. The sample 2422 can be examined using the electron beam 2415 of the SEM 2410. Further, the electron beam 2415 can be used to induce a particle-beam-induced deposition process and/or an EBIE process. Further, the electron beam 2415 of the SEM 2410 can be used to analyze the particle 2050. Moreover, the electron beam 2415 can be used to sense a probe 200, 500, 800, 900, 1000, 1100, 1200, 1300, 1500, 1600, 1640, 1670 of the scanning probe microscope 2470.

The electrons backscattered from the electron beam 2415 by the sample 2422 and the secondary electrons produced by the electron beam 2415 in the sample 2422 are registered by the detector 2427. Further, the detector 2427 identifies the produced secondary electrons when scanning the marking(s) 1030, 1240, 1260, 1690 applied to the probe 1100, 1200, 1670. The detector 2427 that is arranged in the electron column 2417 is referred to as an "in lens detector." The detector 2427 can be installed in the column 2417 in various embodiments. The detector 2427 can also be used to detect electrons backscattered from the sample 2422 or a probe 100, 200, 500, 800, 900, 1000, 1100, 1200, 1300, 1500, 1600, 1640, 1670 or a detection structure 230, 530, 1030, 1130, 1230, 1330, 1530, 1630, 1690 applied to the probe 200, 500, 800, 900, 1000, 1100, 1200, 1300, 1500, 1600, 1640, 1670. The detector 2427 is controlled by the control device 2430 of the apparatus 2400. Further, the apparatus 2400 contains the detection system 290 of FIG. 2. The detection system 290 is likewise controlled by the control device 2430.

The apparatus 2400 contains a third detector 2435. The third detector 2435 is designed to detect electromagnetic radiation, particularly in the x-ray region. As a result, the detector 2435 facilitates the analysis of a particle 2050 that is excited by the electron beam 2415 in order to determine the material composition of said particle. The sample stage 2425 is lowered and/or the sample 2422 is removed from the beam direction of the electron beam 2415 during the analysis of the particle 2050. The detector 2435 is likewise controlled by the control device 2430.

The control device 2430 and/or the computer system 2440 can set the parameters of the electron beam 2415 for inducing a deposition process or an EBIE process and for analyzing the particle 2050. Furthermore, the control device 2430 of the apparatus 2400 receives the measurement data of the detector 2427. The control device 2430 can generate images from the measurement data, said images being represented on a monitor 2437. Further, the control device 2430 can receive measurement data from secondary electrons 260 of the detection system 290 and display said measurement data on the monitor 2437 of the computer system 2440. Moreover, the control device 2430 can contain an ASIC, which can carry out a quick (<10 µs) coordinate transformation between the coordinate system of the sample stage 2425 and a coordinate system of a probe 100, 200, 500, 800, 900, 1000, 1100, 1200, 1300, 1500, 1600, 1640, 1670. Moreover, the computer system 2440 or the control unit can contain a signal processing unit 1750, which matches the excitation of a vibration of the probe 100, 200, 500, 800, 900, 1000, 1100, 1200, 1300, 1500, 1600, 1640, 1670 and the scanning of the electron beam 2415 to one another.

As already explained above, the electron beam 2415 of the modified SEM 2410 can be used to induce an electron-beam-induced deposition process and an EBIE process. The exemplary scanning electron microscope 2410 of FIG. 24 has three different supply containers 2445, 2450 and 2455 for the purposes of carrying out these processes.

The first supply container 2445 stores a first precursor gas, for example a metal carbonyl, for instance chromium hexacarbonyl ($Cr(CO)_6$), or a carbon-containing precursor gas, such as pyrene, for instance. Further carbon-containing precursor gases are specified above. With the aid of the precursor gas stored in the first supply container 2445, a sacrificial tip 2040 or connecting material 2160 can be deposited on the sacrificial tip 2040 and/or the particle 2050 in a local chemical reaction, with the electron beam 2415 of the SEM 2410 acting as an energy supplier in order to split the precursor gas stored in the first supply container 2445 at the location at which material should be deposited. This means that the combined provision of an electron beam 2415 and a precursor gas 2150 leads to an EBID (electron beam induced deposition) process being carried out for local deposition of a sacrificial tip 2014 and/or of connecting material 2150. The modified SEM 2410 forms a deposition apparatus in combination with the first supply container 2445.

An electron beam 2415 can be focused onto a spot diameter of a few nanometers. As a result, an EBID process allows the local deposition of connecting material 2150 with a spatial resolution in the low two-digit nanometer range.

In the apparatus 2400 illustrated in FIG. 24, the second supply container 2450 stores an etching gas 2350, which makes it possible to perform a local electron beam induced etching (EBIE) process. A particle 2050 can be removed from a sacrificial tip 2040 with the aid of an electron-beam-induced etching process. An etching gas 2350 can comprise for example xenon difluoride ($XeF_2$), chlorine ($Cl_2$), oxygen ($O_2$), ozone ($O_3$), water vapor ($H_2O$), hydrogen peroxide ($H_2O_2$), dinitrogen monoxide ($N_2O$), nitrogen monoxide (NO), nitrogen dioxide ($NO_2$), nitric acid ($HNO_3$), ammonia ($NH_3$) or sulfur hexafluoride ($SF_6$). Consequently, the modified SEM 2410 forms a separating apparatus in combination with the second supply container 2450.

An additive gas can be stored in the third supply container 2455, said additive gas, where necessary, being able to be added to the etching gas 2350 kept available in the second supply container 2450 or to the precursor gas 2150 stored in the first supply container 2445. Alternatively, the third supply container 2455 can store a second precursor gas or a second etching gas.

In the scanning electron microscope 2410 illustrated in FIG. 24, each of the supply containers 2445, 2450 and 2455 has its own control valve 2446, 2451 and 2456 in order to monitor or control the amount of the corresponding gas that is provided per unit time, i.e., the gas volumetric flow at the location 2420 of the incidence of the electron beam 2415 on the sample 2422. The control valves 2446, 2451 and 2456 are controlled and monitored by the control device 2430. Using this, it is possible to set the partial pressure conditions of the gas or gases provided at the processing location 2420 for carrying out an EBID and/or EBIE process in a wide range.

Furthermore, in the exemplary SEM 2410 in FIG. 24, each supply container 2445, 2450 and 2455 has its own gas feedline system 2447, 2452 and 2457, which ends with a nozzle 2448, 2453 and 2458 in the vicinity of the point of incidence 2420 of the electron beam 2415 on the sample 2422.

The supply containers 2445, 2450 and 2455 can have their own temperature setting element and/or control element, which allows both cooling and heating of the corresponding supply containers 2445, 2450 and 2455. This makes it possible to store and in particular provide the precursor gas and/or the etching gas(es) 2350 at the respectively optimum temperature (not shown in FIG. 24).

The control device 2430 can control the temperature setting elements and the temperature control elements of the supply containers 2445, 2450, 2455. During the EBID and the EBIE processing processes, the temperature setting elements of the supply containers 2445, 2450 and 2455 can further be used to set the vapor pressure of the precursor gas or gases 2150 stored therein by way of the selection of an appropriate temperature.

The apparatus 2400 can comprise more than one supply container 2445 in order to store two or more precursor gases 2150. Further, the apparatus 2400 can comprise more than one supply container 2450 in order to store two or more etching gases 1650.

The scanning electron microscope 2410 illustrated in FIG. 24 can be operated under ambient conditions or in a vacuum chamber 2460. Implementing the EBID and EBIE processes necessitates negative pressure in the vacuum chamber 2460 relative to the ambient pressure. For this purpose, the SEM 2410 in FIG. 24 comprises a pump system 2462 for generating and for maintaining a negative pressure required in the vacuum chamber 2460. With closed control valves 2446, 2451 and 2456, a residual gas pressure of $<10^{-4}$ Pa is achieved in the vacuum chamber 1460. The pump system 2462 can comprise separate pump systems for the upper part of the vacuum chamber 2460 for providing the electron beam 2415 of the SEM 2410 and for the lower part 2465 or the reaction chamber 2465 (not shown in FIG. 24).

Additionally, the exemplary apparatus 2400 illustrated in FIG. 24 comprises a scanning probe microscope 2470 which, in the apparatus 2400, is embodied in the form of a scanning force microscope (SFM) 2470 or an atomic force microscope (AFM) 2470. The scanning probe microscope 2470 can receive the probes 100, 200, 500, 800, 900, 1000, 1100, 1200, 1300, 1500, 1600, 1640, 1670. Moreover, the AFM 2470 can be used to examine the photomask 2010 and/or to analyze the particle 2050.

The measuring head 2475 of the scanning probe microscope 2470 is illustrated in the apparatus 2400 of FIG. 24. The measuring head 2475 comprises a holding apparatus 2480. The measuring head 2475 is fastened to the frame of the apparatus 2400 by use of the holding apparatus 2480 (not shown in FIG. 24). A piezo-actuator in the form of a quad-morph piezo-actuator 1910 which facilitates a movement of the free end of the piezo-actuator 1910 in three spatial directions (not illustrated in FIG. 24) is attached to the holding apparatus 2480 of the measuring head 2475. A probe 200 is fastened to the free end of the piezo-actuator 1910. However, the quad-morph piezo-actuator 1910 can also receive the probes 100, 500, 800, 900, 1000, 1100, 1200, 1300, 1500, 1600, 1640, 1670 (not shown in FIG. 24). The free end of the cantilever 110 of the probe 200 has the measuring tip 220 and a detection structure 230 in the form of the detection area 230.

As symbolized by arrows in FIG. 24, the sample stage 2425 can be moved by a positioning system 2427 in three spatial directions relative to the measuring head 2475 of the AFM 2470 and/or the point of incidence 2420 of an electron beam 2415. In the example in FIG. 24, the positioning system 2427 is embodied in the form of a plurality of micromanipulators or displacement elements. The movement of the sample stage 2425 in the sample plane, i.e., in the xy-plane, which is perpendicular to the beam direction of the electron beam 2415, can be controlled by two interferometers (not shown in FIG. 24). In an alternative embodiment, the positioning system 2427 can additionally contain piezo-actuators (not illustrated in FIG. 24). The positioning system 2427 is controlled by signals of the control device 2430. In an alternative embodiment, the control device 2430 does not move the sample stage 2425, but rather the holding apparatus 2480 of the measuring head 2475 of the AFM 2470. It is furthermore possible for the control device 2430 to perform a coarse positioning of the sample 2422 or the mask 2010 in height (z-direction) and for the piezo-actuator 1910 of the measuring head 2480 to perform a precise height setting of the AFM 2470. The control device 2430 can be part of a computer system 2440 of the apparatus 2400.

The AFM 2470 can be used to position the probes 100, 200, 500, 800, 900, 1000, 1100, 1200, 1300, 1500, 1600, 1640, 1670 in relation to a particle 2050. Further, the AFM 2470 can be used to remove a probe 200, 500, 800, 900, 1000, 1100, 1200, 1300, 1500, 1600, 1640, 1670 laden with a particle 2050 from the photolithographic mask 2010 by way of movement.

Figure 25:
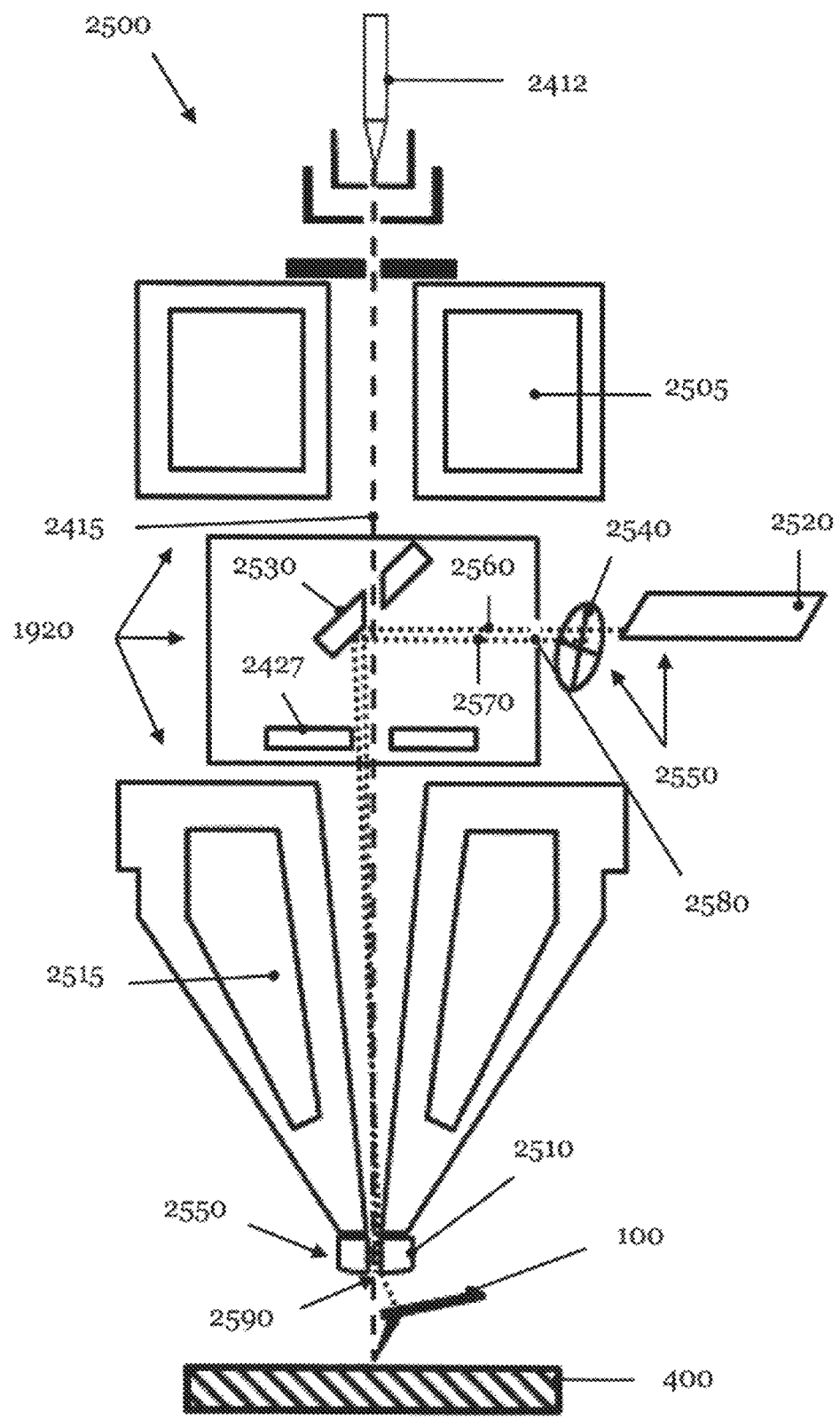
FIG. 25 shows a section through a combination of a scanning electron microscope and an atomic force microscope, in which the radiation of a light pointer system for detecting the deflection of a probe of the atomic force microscope is partly guided in the column of the scanning electron microscope.

FIG. 25 shows a section through an apparatus 2500, which can likewise be used to examine and/or process a photolithographic element. Unlike the apparatus 2400, the apparatus 2500 makes do without changing the probe 100 of a scanning probe microscope 2470. In place of an electron beam 2415 like in FIG. 24, the apparatus 2500 uses a light pointer system 2550 for detecting the deflection of the probe 100 of a scanning probe microscope 2470. The electon source 2412, or more generally a particle source, produces an electron beam 2415 or a charged particle beam. The two parts 2505 and 2515 of the beam optical unit focus the electron beam 2415 onto the outlet opening 2590 of the lens 2510. The detector 2427, which is explained in the context of FIG. 24, is situated in the column 1920 of the apparatus 2500.

The following describes the modifications undertaken on a scanning electron microscope 2410 in order to partly guide the light pointer system 2550 within the column 1920 of a scanning electron microscope. The column 1920 of the scanning electron microscope comprises a window 2580 in order to couple or decouple optical radiation of the light pointer system 2550 into the vacuum environment within the column 1920. A lens 2510, which decouples radiation guided within the column 1920 from the column 1920 or couples light reflected by the probe 100 into the column 1920, is attached to the outlet opening 1930 of the column 1920.

The exemplary light pointer system 2550 in FIG. 25 uses a laser system 2520, for example a semiconductor laser, to steer light 2560 through the window 2580 onto the cantilever 110 of the probe 100 via the deflection mirror 2530 and the lens 2510. The light 2570 reflected by the probe 100 or the top side 115 of the cantilever 110 of the probe 100 is collected by the lens 2510 and steered onto the photodetector 2540 via the deflection mirror 2530 and the window 2580. By way of example, the photodetector 2540 can be embodied as a four-quadrant photodiode. In order to prevent electrostatic charging by electrons scattered within the column 1920, the optical window 2580, the deflection mirror 2530 and the lens 2510 can be coated with an optically transparent and electrically conductive layer, for example an indium tin oxide layer.

Figure 26:
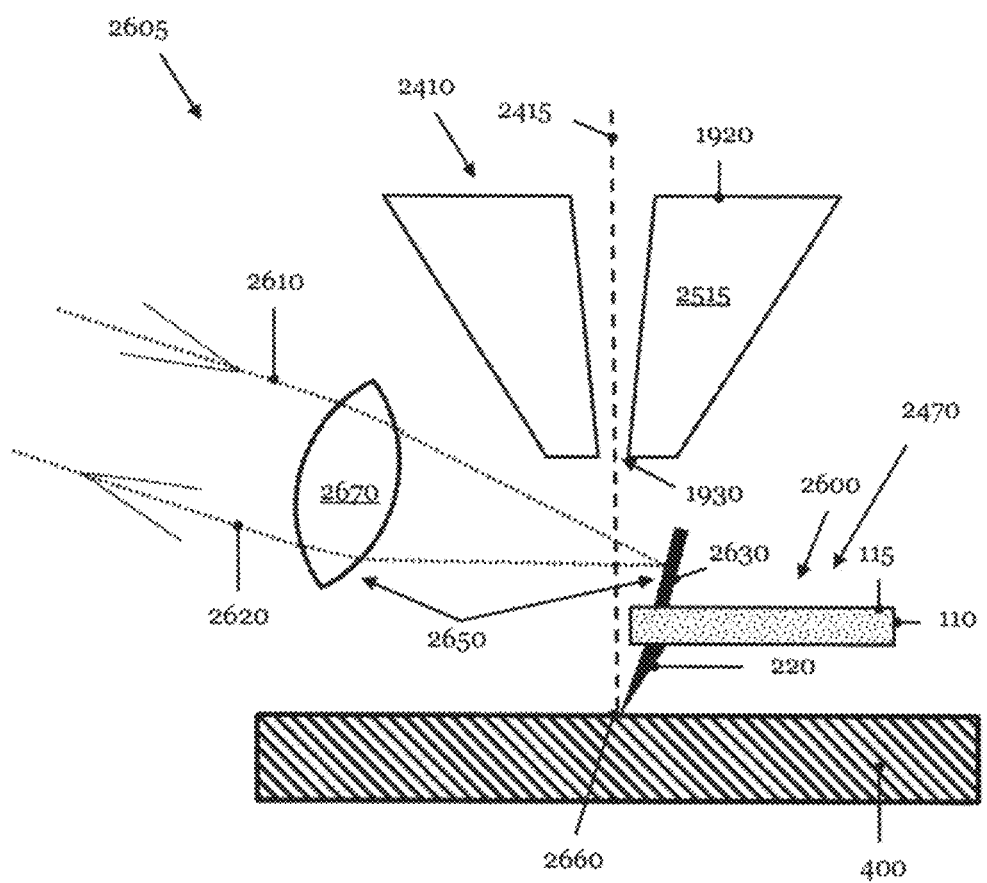
FIG. 26 presents a schematic section through a combination of a scanning particle microscope, a scanning probe microscope and a light pointer system, wherein the light pointer system has a reflection structure arranged on the probe, said reflection structure being arranged on the probe of the scanning probe microscope at an angle that differs from zero.

The diagram 2605 in FIG. 26 schematically shows a section through some components of a second exemplary embodiment of an optical light pointer system 2650 which allows the combination of a scanning particle microscope 2410 and a scanning probe microscope 2770 with an overlapping interaction region 2660, without having a negative influence on the capability of the two tools 2410 and 2470. The scanning particle microscope is elucidated by the lower part 2515 of the beam optical unit of a scanning electron microscope 2410. An electron beam 2415 leaves the scanning particle microscope 2410 at the output 1930 of the beam optical unit 2515 or the column 1920 and said electron beam is incident on the sample 400 in the interaction region 2660.

A probe 2600 of a scanning probe microscope 2470 is positioned under the column 1920, the measuring tip 120 of said probe likewise interacting with the sample 400 in the interaction region 2660. A reflection element 2630 is attached to the probe 2600 on the front side 115 of the probe 2600 at an angle that differs from zero in relation to the surface of the cantilever 110. A light source, not illustrated in FIG. 26, of the light pointer system 2650 radiates light or optical radiation 2610 onto the reflection element 2630 via the lens 2670. The reflection element 2630 reflects the optical radiation 2620 through the lens 2670 of the light pointer system 2650 onto the detection system, likewise suppressed in FIG. 26, of the light pointer system 2650. The reflection element 2630 can comprise a mirror. However, it is also possible for the reflection element 2630 to have a curved form and consequently, in addition to reflecting the optical radiation 2610, additionally image the reflected radiation 2620.

The reflection element 2630 can be arranged at an angle range from 50° to 85° in relation to the surface 115 of the cantilever 110 of the probe 2600. In the example presented in FIG. 26, the reflection element 2630 has an angle of approximately 75°. The reflection element 2630 can comprise a metal coating, for instance a gold, silver or aluminum coating.

Figure 27:
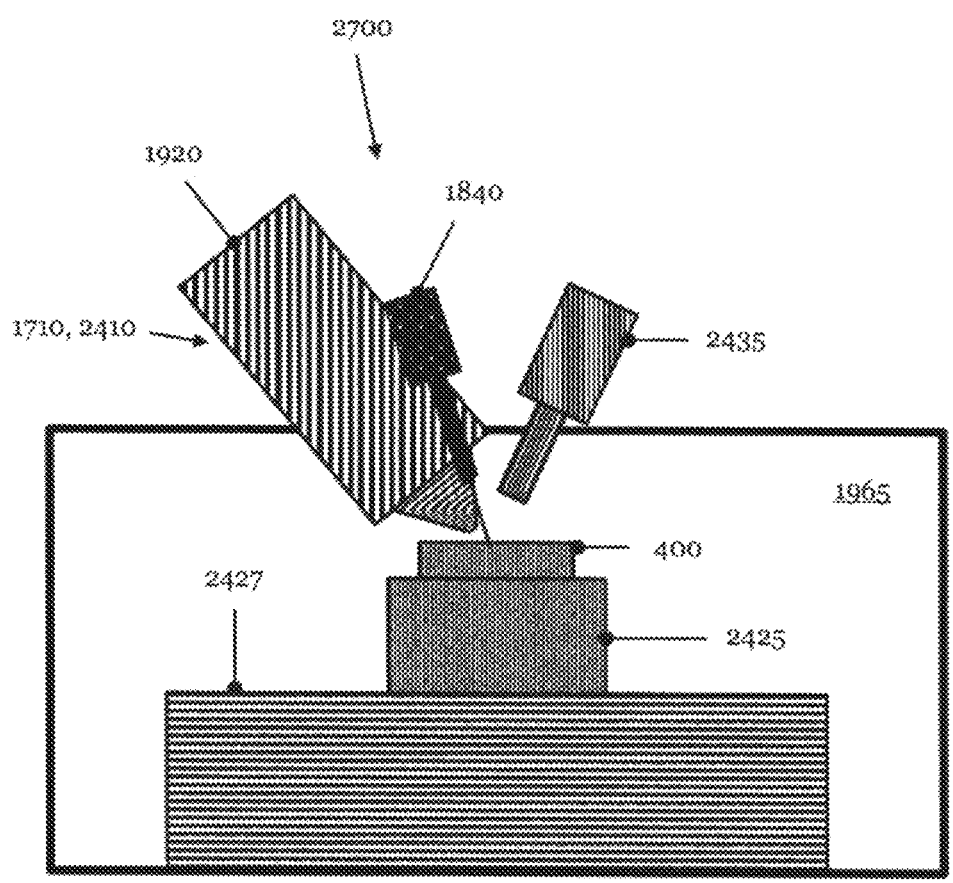
FIG. 27 presents a section through a combination of a scanning electron microscope and a nano-manipulator, which is arranged in the column of the scanning electron microscope in a manner rotated with respect to the sample normal.

FIG. 27 shows a schematic section through an apparatus 2700, which combines a scanning electron microscope 1710, 2410 and a nano-manipulator 1840 as well as the energy-dispersive detector for x-ray radiation 2435. The column 1920 of the scanning electron microscope 1710, 2410 is tilted in relation to the sample normal in the apparatus 2700 in order to make more space for processing the sample 400 using the nano-manipulator 1840. The components of the apparatus 2700 have been explained in the context of the discussion of FIGS. 17 and 24.

Figure 28:
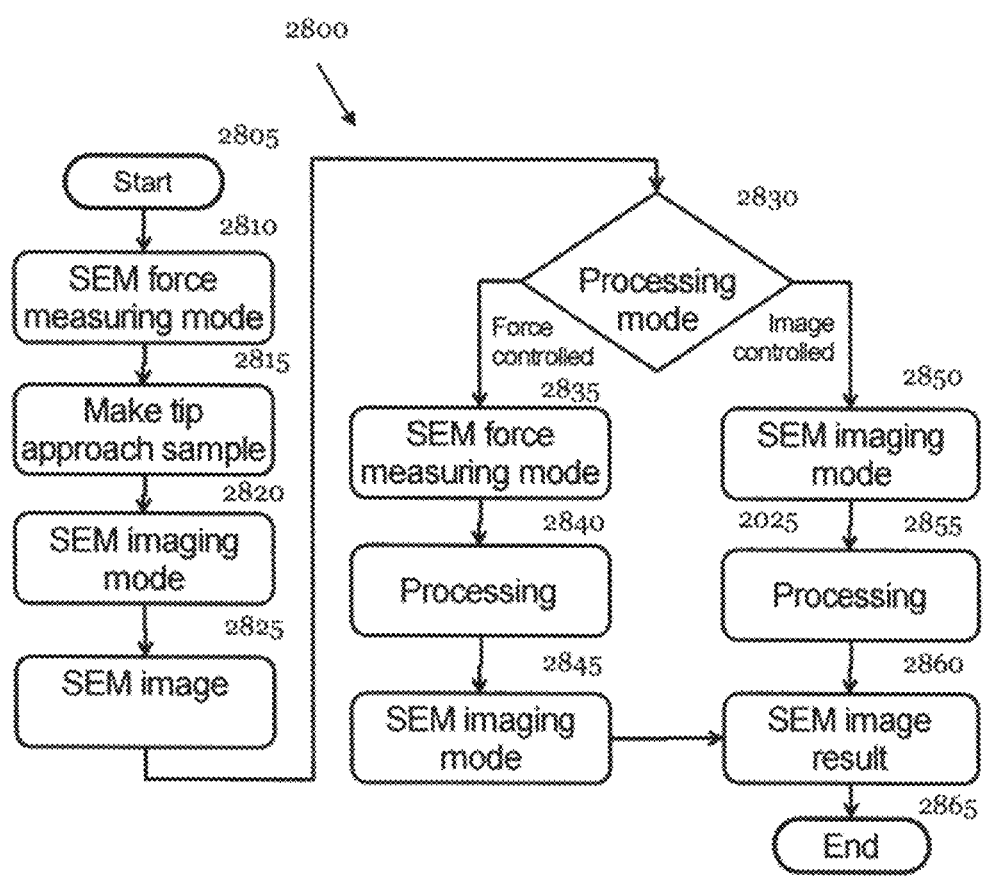
FIG. 28 reproduces a flowchart of a processing procedure of a sample using one of the apparatuses of FIGS. 24 to 26.

The flowchart 2800 in FIG. 28 provides an overview of a processing procedure, which can be carried out on a sample 400 by use of either of the apparatuses 2400 and 2700. The method begins in step 2805. The scanning electron microscope 2410 is switched into a force measuring mode in a first step 2810; i.e., the electron beam 240, 1040 is positioned on the detection area 230, 530 of the probe 200, 500, 1000 or the electron beam 1140 is scanned over the marking(s) 1130, 1240, 1460 or the detection structures 1130, 1230, 1690 of the probe 1100, 1200, 1670. It is also possible to scan the electron beam in a line scan over the detection structures 1330, 1530, 1630, 1670 of the probes 1300, 1500, 1600, 1640.

Thereupon, the measuring tip 120, 150, 170, 220 of the probe 100, 200, 500, 800, 900, 1000, 1100, 1200, 1300, 1500, 1600, 1640, 1670 is made to approach the sample 400 in step 2820; in the process, the deflection of the probe 100, 200, 500, 800, 900, 1000, 1100, 1200, 1300, 1500, 1600, 1640, 1670 is monitored with the aid of the electron beam 240, 1140. Once the approach process has been completed, the electron beam of the scanning electron microscope 2410 is focused on the sample 400 in step 2825 and an image of the surroundings of the measuring tip 120, 150, 170, 220 is recorded by scanning the sample 400.

A decision is made in decision block 2830 as to whether the processing procedure of the sample 400 is force controlled, i.e., the electron beam 240 is directed onto the detection area 230, 1030 of the probe 200, 800, 1000 or the marking 1130, 1240, 1260 of the probe 1100, 1200, or image controlled, i.e., the electron beam 840 scans over the sample 400 during the process.

If the force-controlled mode is used, the scanning electron microscope 2410 is switched back into the force measuring mode in step 2835. The sample 400 is processed by the measuring tip 220 of the probe 200, 800, 900, 1000 in step 2840. During the processing 2840 of the sample 400, the particle 2050 can be displaced on the sample 400, for example, and/or it can be removed from the sample 400, as explained in the context of FIGS. 20 to 22. The sample 400 is scanned anew by the electron beam 840 in step 2845 in order to check whether the processing procedure was successful. The resultant SEM image is displayed by the monitor 2437 of the apparatus 2400, 2500, 2700 in step 2860.

If a decision is made in decision block 2830 in respect of monitoring the processing procedure in image-controlled fashion, the scanning electron microscope is switched into the imaging mode in step 2850, i.e., the electron beam 840 scans over the sample 400 during the processing procedure. Processing of the sample 400 is carried out in step 2855 and the image of the sample 400 recorded after the completion of the processing procedure is displayed on the monitor 2437 of the apparatus 2400, 2500 or 2700 in step 2860. Finally, the processing procedure ends in block 2865.

Finally, the flowchart 2900 in FIG. 29 schematically shows essential steps of the process of moving a particle 2050 from a photolithographic element 400, 2010. The method begins in step 2910. In step 2920, a probe 100, 200, 500, 800, 900, 1000, 1100, 1200, 1300, 1500, 1600, 1640, 1670 that is movable relative to the sample 400 or the photolithographic element 2010 is positioned in the vicinity of the particle 2050 to be moved. In the next step 2930, a charged particle beam 240, 1140 of a scanning particle microscope 2410, a light pointer system 2550, 2650, which is at least partly guided in the scanning particle microscope 2410, or a light pointer system 2650, which comprises a reflection structure 2630 arranged on a probe 2600, said reflection structure being arranged at an angle that differs from zero on a front side 115 of the probe 2600, is used for the purposes of determining a deflection of the probe 100, 200, 500, 800, 900, 1000, 1100, 1200, 1300, 1500, 1600, 1640, 1670 during the positioning. Thereupon, the particle 2050 is moved in step 2940 by moving the probe 100, 200, 500, 800, 900, 1000, 1100, 1200, 1300, 1500, 1600, 1640, 1670 relative to the sample 400, 2010. Finally, the method ends in step 2950.

What is claimed is:

1. An apparatus for examining and/or processing a sample, the apparatus comprising:
   a. scanning particle microscope for providing a beam of charged particles, which can be directed on a surface of the sample; and
   b. scanning probe microscope with a deflectable probe and a light pointer system for detecting a deflection of the probe;
   c. wherein the light pointer system is guided at least in part in a column of the scanning particle microscope.

2. The apparatus of claim 1, wherein the scanning particle microscope comprises, at its outlet opening for the beam of charged particles, at least one lens for the light pointer system with an opening for the passage of the beam of charged particles.

3. The apparatus of claim 2, wherein the scanning particle microscope comprises a deflection mirror and a window of the light pointer system.

4. The apparatus of claim 2, wherein optical elements of the light pointer system, which are arranged in the scanning particle microscope, have an optically substantially transparent and electrically conductive coating.

5. The apparatus of claim 2, further comprising a detector for detecting x-ray radiation.

6. The apparatus of claim 1, wherein the scanning particle microscope comprises a deflection mirror and a window of the light pointer system.

7. The apparatus of claim 6, wherein optical elements of the light pointer system, which are arranged in the scanning particle microscope, have an optically substantially transparent and electrically conductive coating.

8. The apparatus of claim 6, further comprising a detector for detecting x-ray radiation.

9. The apparatus of claim 1, wherein optical elements of the light pointer system, which are arranged in the scanning particle microscope, have an optically substantially transparent and electrically conductive coating.

10. The apparatus of claim 9, further comprising a detector for detecting x-ray radiation.

11. The apparatus of claim 1, further comprising a detector for detecting x-ray radiation.

12. A method for moving a particle on a photolithographic sample, including the following steps:
    a. positioning a probe that is movable relative to the sample in the vicinity of the particle to be moved;
    b. using a charged particle beam of a scanning particle microscope, a light pointer system, which is at least partly guided in the scanning particle microscope, or a light pointer system, which comprises a reflection structure arranged on a probe, said reflection structure being arranged at an angle that differs from zero on a surface of the probe, for the purposes of determining a deflection of the probe during the positioning; and
    c. moving the particle by moving the probe relative to the sample.

13. The method of claim 12, further comprising the step of: imaging the sample and/or the particle using the particle beam of the scanning particle microscope.

14. The method of claim 13, further comprising the step of:
    connecting the probe to the particle.

15. The method of claim 12, further comprising the step of:
    connecting the probe to the particle.

16. A computer program comprising instructions which, when executed by a computer system, cause the apparatus of claim 1 to carry out a method for moving a particle on a photolithographic sample, including the following steps:
    positioning a probe that is movable relative to the sample in the vicinity of the particle to be moved;
    using a charged particle beam of a scanning particle microscope, a light pointer system, which is at least partly guided in the scanning particle microscope, or a light pointer system, which comprises a reflection structure arranged on a probe, said reflection structure being arranged at an angle that differs from zero on a surface of the probe, for the purposes of determining a deflection of the probe during the positioning; and
    moving the particle by moving the probe relative to the sample.

17. The computer program of claim 16, comprising instructions which, when executed by the computer system, cause the apparatus of claim 1 to carry out the method for moving a particle on a photolithographic sample,
    wherein the method for moving a particle on a photolithographic sample further includes the following step:
        imaging the sample and/or the particle using the particle beam of the scanning particle microscope.

18. The computer program of claim 16, comprising instructions which, when executed by the computer system, cause the apparatus of claim 1 to carry out the method for moving a particle on a photolithographic sample,
    wherein the method for moving a particle on a photolithographic sample further includes the following step:
        connecting the probe to the particle.

19. The computer program of claim 16, comprising instructions which, when executed by the computer system, cause the apparatus of claim 2 to carry out the method for moving a particle on a photolithographic sample.

20. The computer program of claim 16, comprising instructions which, when executed by the computer system, cause the apparatus of claim 6 to carry out the method for moving a particle on a photolithographic sample.

* * * * *